(12) United States Patent
Jiang et al.

(10) Patent No.: US 11,882,690 B2
(45) Date of Patent: Jan. 23, 2024

(54) SEMICONDUCTOR STRUCTURE HAVING TAPERED BIT LINE

(71) Applicant: NANYA TECHNOLOGY CORPORATION, New Taipei (TW)

(72) Inventors: Pei-Rou Jiang, Tainan (TW); Chao-Wen Lay, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 90 days.

(21) Appl. No.: 17/837,052

(22) Filed: Jun. 10, 2022

(65) Prior Publication Data

US 2023/0403845 A1 Dec. 14, 2023

(51) Int. Cl.
*H10B 12/00* (2023.01)
*H01L 21/768* (2006.01)

(52) U.S. Cl.
CPC ..... *H10B 12/482* (2023.02); *H01L 21/76852* (2013.01)

(58) Field of Classification Search
CPC ................ H10B 12/482; H10B 12/485; H01L 21/76852

USPC .................................. 257/906, 907; 438/262
See application file for complete search history.

(56) References Cited

U.S. PATENT DOCUMENTS

2021/0296237 A1* 9/2021 Kim ..................... H10B 12/053

FOREIGN PATENT DOCUMENTS

| TW | 202213650 A | 4/2022 |
| TW | 202220170 A | 5/2022 |

OTHER PUBLICATIONS

Office Action and Search Report dated Aug. 18, 2023 related to Taiwanese Application No. 111139661.

* cited by examiner

*Primary Examiner* — Hoai V Pham
(74) *Attorney, Agent, or Firm* — Xuan Zhang

(57) ABSTRACT

The present disclosure provides a semiconductor structure having a bit line with a tapered configuration. The semiconductor structure includes: a substrate; a bit line structure, disposed over the substrate, wherein the bit line structure includes a cylindrical portion and a step portion above the cylindrical portion; a polysilicon layer, disposed over the substrate and around the bit line structure; and a landing pad, disposed over the polysilicon layer and the step portion.

19 Claims, 30 Drawing Sheets

SEMICONDUCTOR STRUCTURE HAVING TAPERED BIT LINE

TECHNICAL FIELD

The present disclosure relates to a semiconductor structure. Particularly, the present disclosure relates to a bit line structure having a tapered configuration.

DISCUSSION OF THE BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements on the substrate. As the semiconductor industry has progressed into advanced technology process nodes in pursuit of greater device density, higher performance, and lower costs, challenges of precise control of lithography across a wafer have arisen, and a product performance and a product yield can be also affected.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate; a bit line structure, disposed over the substrate, wherein the bit line structure includes a cylindrical portion and a step portion above the cylindrical portion; a polysilicon layer, disposed over the substrate and around the bit line structure; and a landing pad, disposed over the polysilicon layer and the step portion.

In some embodiments, a top surface of the step portion is a top surface of the bit line structure.

In some embodiments, the step portion is entirely above the polysilicon layer.

In some embodiments, the semiconductor structure further includes: a spacer, disposed between the polysilicon layer and the bit line structure, wherein the spacer surrounds the cylindrical portion of the bit line structure.

In some embodiments, the spacer is a multi-layer structure, and includes nitride and oxide.

In some embodiments, the spacer covers an entirety of the cylindrical portion of the bit line structure.

In some embodiments, a top surface of the spacer is above a top surface of the polysilicon layer.

In some embodiments, the step portion has differing widths along a height of the bit line structure.

In some embodiments, the bit line structure includes a conductive layer under a top surface of the polysilicon layer.

Another aspect of the present disclosure provides a semiconductor structure. The semiconductor structure includes: a substrate; a bit line structure, disposed on the substrate and extending in a first direction; and a polysilicon layer, disposed around a lower portion of the bit line structure, wherein an upper portion of the bit line structure is tapered from the lower portion of the bit line structure toward a top surface of the bit line structure.

In some embodiments, the semiconductor structure further includes: a metal layer, disposed over the polysilicon layer and partially covering the upper portion of the bit line structure.

In some embodiments, the metal layer includes an opening exposing a portion of the upper portion of the bit line structure.

In some embodiments, the semiconductor structure further includes: a word line structure, disposed on the substrate and extending in a second direction different from the first direction.

In some embodiments, the polysilicon layer surrounds a lower portion of the word line structure.

In some embodiments, the word line structure includes an upper portion tapered from a top surface of the polysilicon layer.

In some embodiments, the semiconductor structure further includes: a spacer, disposed on a sidewall of the bit line structure and surrounding the lower portion of the bit line structure.

In some embodiments, the spacer protrudes from the polysilicon layer.

In some embodiments, a portion of the spacer is exposed through a metal layer disposed over the bit line structure.

In some embodiments, the lower portion of the bit line structure protrudes from the top surface of the polysilicon layer.

Another aspect of the present disclosure provides a method of manufacturing a semiconductor structure. The method includes: providing a substrate; forming a bit line structure over the substrate; forming a spacer surrounding the bit line structure; forming a polysilicon layer covering the bit line structure and the spacer; performing a first etching operation on the polysilicon layer to obtain a first height of the polysilicon layer, wherein the first height is less than a height of the bit line structure or a height of the spacer; performing a second etching operation on a first portion of the spacer; and performing a third etching operation on the polysilicon layer to obtain a second height of the polysilicon layer, wherein the second height is less than the first height.

In some embodiments, the first portion of the spacer is exposed through the polysilicon layer and is removed by the second etching operation.

In some embodiments, a width of a first portion of the bit line structure surrounded by the first portion of the spacer is substantially consistent during the second etching operation.

In some embodiments, the method further includes: performing a fourth etching operation on a second portion of the spacer and a first portion of the bit line structure disposed above the second portion of the spacer.

In some embodiments, the first portion of the bit line structure is partially removed by the fourth etching operation.

In some embodiments, the second portion of the spacer is exposed through the polysilicon layer and is removed by the fourth etching operation.

In some embodiments, the method further includes: performing a fifth etching operation on the polysilicon layer to form a polysilicon contact, wherein the polysilicon contact includes a third height less than the second height of the polysilicon layer.

In some embodiments, a top surface of the polysilicon contact is at a horizontal level same as or above that of a top surface of a tungsten layer of the bit line structure.

In some embodiments, the method further includes: forming a metal layer covering the bit line structure and the spacer.

In some embodiments, a width of the top surface of the bit line structure is substantially equal to or greater than 12 nanometers prior to the formation of the metal layer.

In some embodiments, the method further includes: performing a sixth etching operation on the metal layer to form a recess on the metal layer.

In some embodiments, the upper portion of the bit line structure is partially removed by the sixth etching operation.

In some embodiments, the spacer is exposed by the recess.

In some embodiments, a top portion of the spacer is removed by the sixth etching operation.

In some embodiments, the height of the bit line structure is substantially consistent during the second etching operation.

In some embodiments, an etching rate of the second etching operation on a nitride material is less than 1 nanometer per second.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
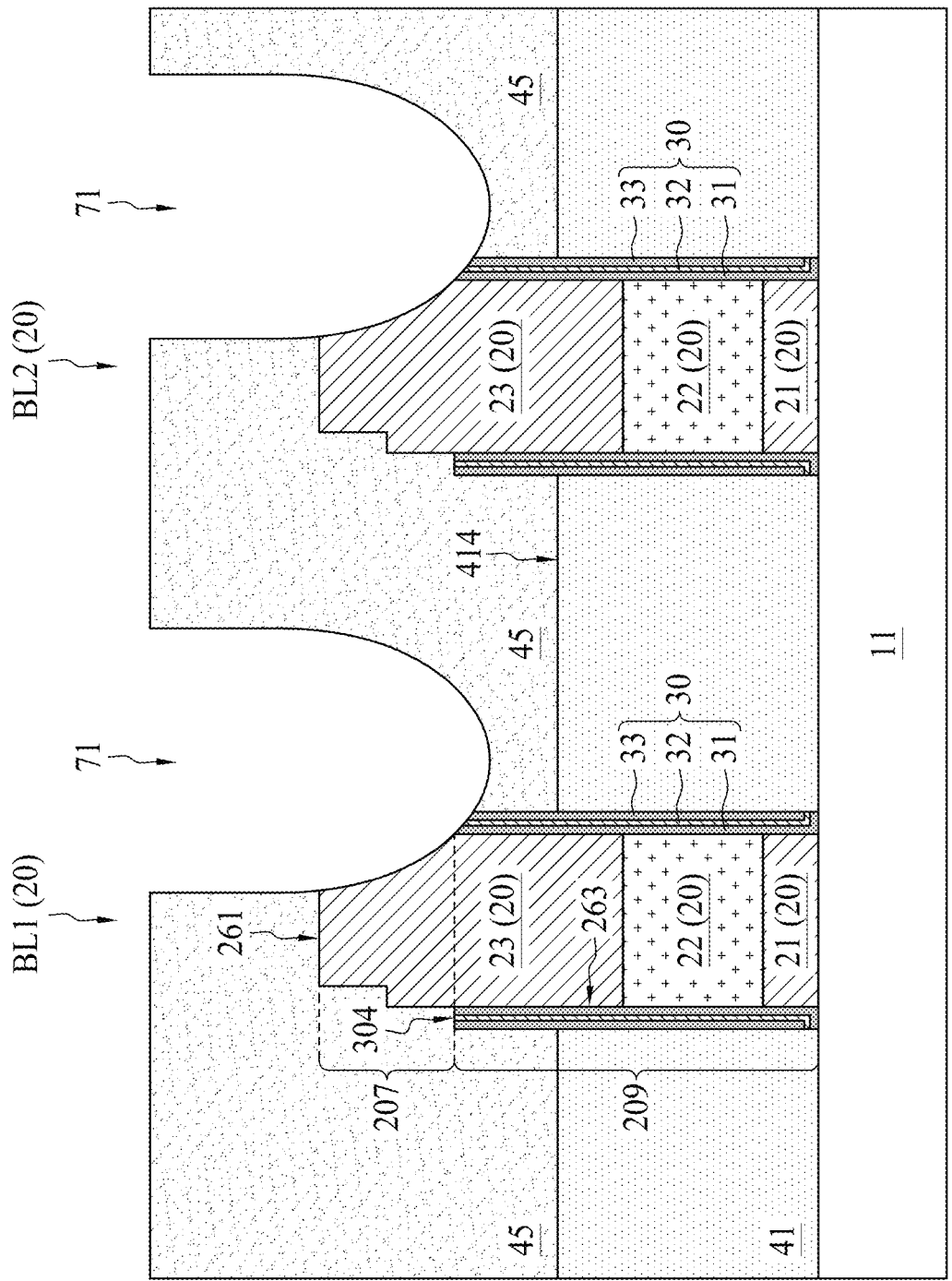
FIG. 1 is a cross-sectional diagram of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it has reached an advanced precision of photolithography. In order to further reduce device sizes, dimensions of elements and distances between different elements have to be proportionally reduced. However, with the reductions in the dimensions of the elements and the distances between different elements, challenges of precise control on the dimensions and the distances have arisen. For instance, a landing pad can be disconnected by a sharp corner of a bit line structure after an etching operation.

FIG. 1 is schematic cross-sectional diagram of a semiconductor structure in accordance with some embodiments of the present disclosure. The semiconductor structure may include a substrate 11, a bit line structure 20 disposed over the substrate, a polysilicon layer 41 disposed over the substrate and around the bit line structure 20, and a landing pad 45 disposed over the polysilicon layer 41 and the bit line structure 20.

In some embodiments, the substrate 11 may have a multilayer structure, or the substrate 11 may include a multilayer compound semiconductor structure. In some embodiments, the substrate 11 includes semiconductor devices, electrical components, electrical elements or a combination thereof. In some embodiments, the substrate 11 includes transistors or functional units of transistors. In some embodiments, the substrate 11 includes active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., system-on-a-chip (SoC), central processing unit (CPU), graphics processing unit (GPU), application processor (AP), microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. The passive components may include a capacitor, a resistor, an inductor, a fuse or other passive components. The conductive elements may include metal lines, metal islands, conductive vias, contacts or other conductive elements.

The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

One or more of the bit line structures 20 are disposed over the substrate 11. In some embodiments, the bit line structures 20 include a first bit line structure BL1 and a second bit line structure BL2. In some embodiments, detailed structures and configurations of the first bit line structure BL1 and the second bit line structure BL2 are substantially identical. For a purpose of brevity, only the first bit line structure BL1 is described in the following description, and detailed description of the second bit line structure BL2 is omitted herein. However, such omission is not intended to limit the present disclosure.

In some embodiments, the first bit line structure BL1 includes a first dielectric layer 21, a conductive layer 22 and a second dielectric layer 23. In some embodiments, the conductive layer 22 is disposed between the first dielectric layer 21 and the second dielectric layer 23. In some embodiments, a thickness of the second dielectric layer 23 is greater than a thickness of the conductive layer 22. In some embodiments, a thickness of the conductive layer 22 is greater than a thickness of the first dielectric layer 21. In some embodiments, the first dielectric layer 21 includes silicon nitride, metallic nitride, or a combination thereof. In some embodiments, the second dielectric layer 23 includes a nitride material same as a nitride material of the first dielectric layer 21. In some embodiments, the conductive layer 22 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials. In some embodiments, the conductive layer 22 includes tungsten.

The semiconductor structure may further include a spacer 30 surrounding a sidewall 263 of the first bit line structure BL1. In some embodiments, the spacer 30 surrounds a lower portion 209 of the first bit line structure BL1. In some embodiments, the lower portion 209 of the first bit line structure BL1 has a cylindrical configuration. In some embodiments, the lower portion 209 may be referred to as a cylindrical portion 209. An upper portion 207 of the first bit line structure BL1 is disposed above and tapered from the lower portion 209 of the first bit line structure BL1. In some embodiments, the upper portion 207 is tapered toward a top surface 261 of the first bit line structure 20. In some embodiments, the upper portion 207 is disposed above the spacer 30. In some embodiments, the upper portion 207 has a stair configuration. In some embodiments, the upper portion 207 is referred to as a step portion 207. In some embodiments, the upper portion 207 is entirely above the conductive layer 22 of the first bit line structure BL1.

The spacer 30 may be a single layer or a multi-layer structure. In some embodiments, the spacer 30 includes a first nitride layer 31, an oxide layer 32 and a second nitride layer 33. In some embodiments, the oxide layer 32 is sandwiched between the first nitride layer 31 and the second nitride layer 33. In some embodiments, a thickness of the first nitride layer 31 is substantially equal to a thickness of the second nitride layer 33. In some embodiments, a thickness of the oxide layer 32 is less than that of the first nitride layer 31 or the second nitride layer 33. In some embodiments, the first nitride layer 31 and the second nitride layer 33 include a same nitride material. In some embodiments, the oxide layer 32 includes silicon oxide. In some embodiments, the first nitride layer 31 or the second nitride layer 33 includes silicon nitride.

The polysilicon layer 41 may be disposed over the substrate 11 and around the bit line structures 20. In some embodiments, the polysilicon layer 41 is disposed between adjacent bit line structures 20. In some embodiments, the polysilicon layer 41 surrounds the bit line structures 20. In some embodiments, the lower portion 209 (or cylindrical portion 209) of the first bit line structure BL1 protrudes from a top surface 414 of the polysilicon layer 41. In some embodiments, the spacer 30 protrudes from the top surface 414 of the polysilicon layer 41. In some embodiments, the top surface 414 of the polysilicon layer 41 is above the conductive layer 22. The polysilicon layer 41 can function as a contact for forming electrical connections to other electrical components, devices or elements in the substrate 11. In some embodiments, the polysilicon layer 41 may include multiple portions (i.e., the polysilicon layer 41 between the first bit line structure BL1 and the second bit line structure BL2 can be one of the multiple portions) electrically isolated from one another, and different portions of the polysilicon layer 41 may electrically connect to different electrical components, devices or elements in the substrate 11.

One or more landing pads 45 may be disposed over the polysilicon layer 41 and the bit line structures 20. In some embodiments, the landing pad 45 includes one or more metallic materials, such as aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, each of the landing pads 45 is disposed over a corresponding portion of the polysilicon layer 41. In some embodiments, the landing pads 45 are electrically isolated from one another.

Figure 2:
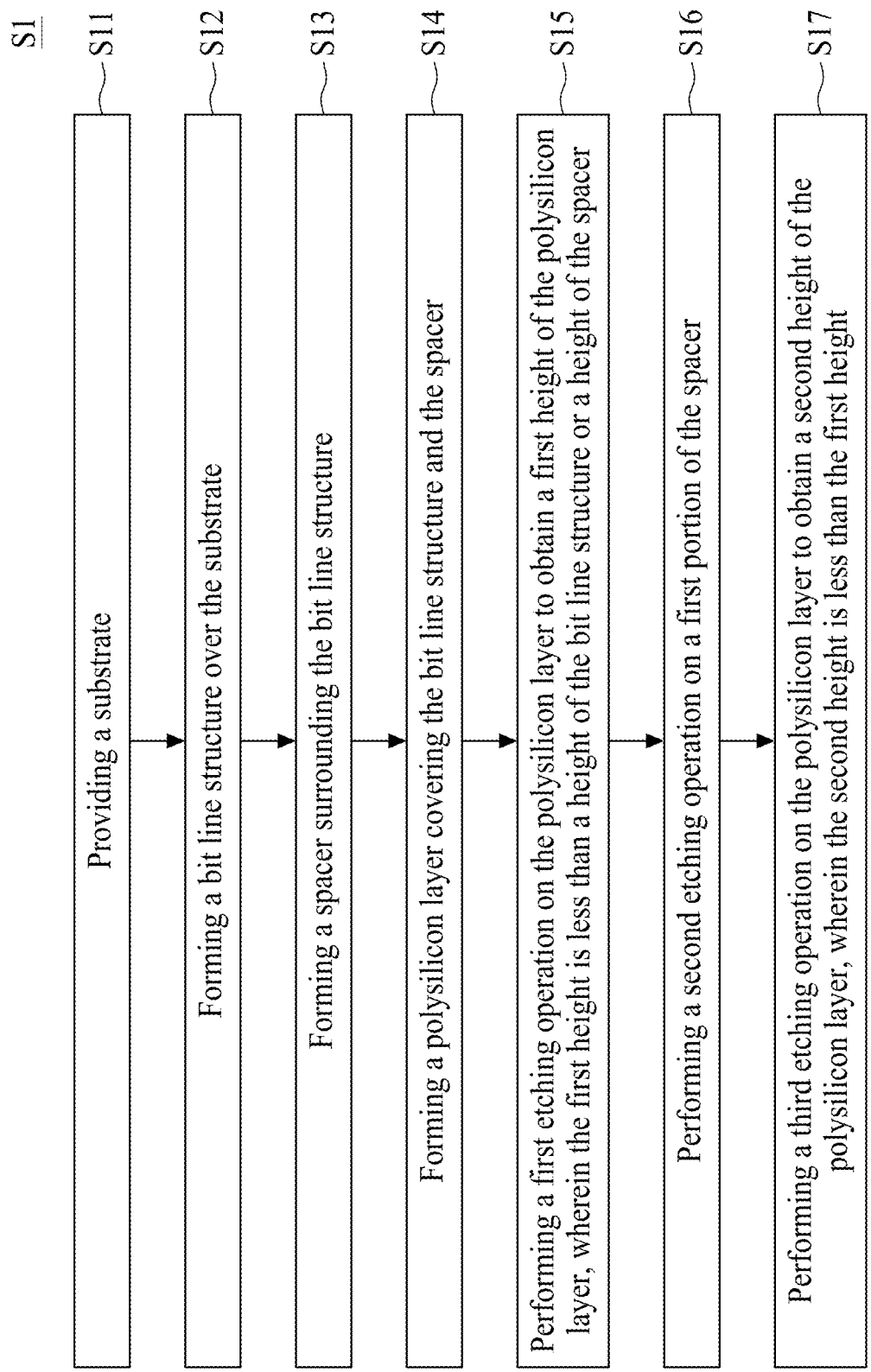
FIG. 2 is a flow diagram illustrating a method of manufacturing a semiconductor structure in accordance with some embodiments of the present disclosure.

FIG. 2 is a flow diagram illustrating a method S1 for manufacturing a semiconductor device in accordance with some embodiments of the present disclosure. The method S1 includes a number of operations (S11, S12, S13, S14, S15, S16 and S17) and the description and illustration are not deemed as a limitation to the sequence of the operations. In the operation S11, a substrate is provided. In the operation S12, a bit line structure is formed over the substrate. In the operation S13, a spacer is formed surrounding the bit line structure. In the operation S14, a polysilicon layer is formed covering the bit line structure and the spacer. In the operation S15, a first etching operation is performed on the polysilicon layer to obtain a first height of the polysilicon layer, wherein the first height is less than a height of the bit line structure or a height of the spacer. In the operation S16, a second etching operation is performed on a first portion of the spacer. In the operation S17, a third etching operation is performed on the polysilicon layer to obtain a second height of the polysilicon layer, wherein the second height is less than the first height. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

Figure 3:
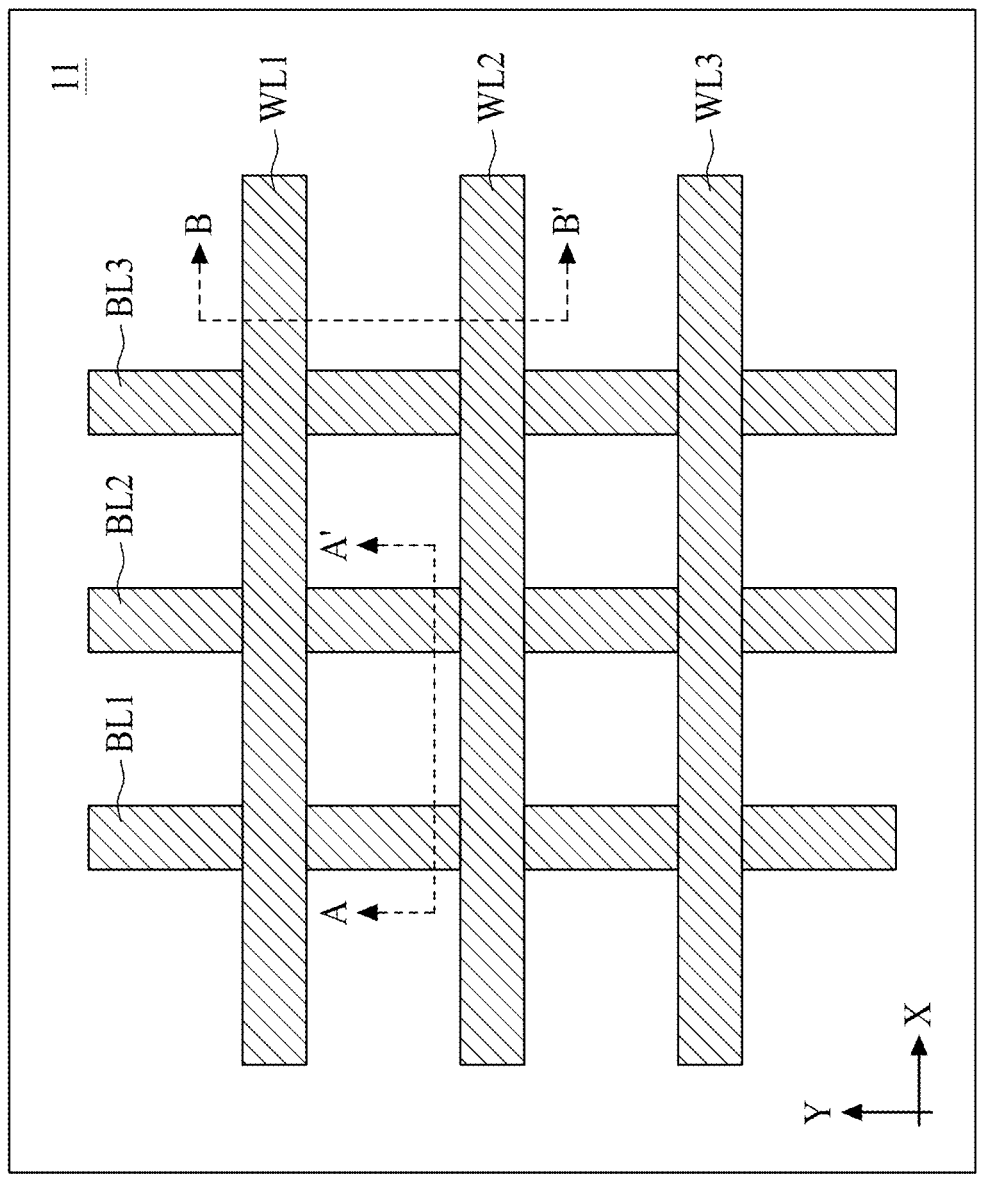
FIG. 3 is a schematic top view of a semiconductor structure in accordance with some embodiments of the present disclosure.

FIG. 3 is a schematic top view of a semiconductor structure in accordance with some embodiments of the present disclosure. In some embodiments, multiple bit line structures and multiple word line structures are disposed over a substrate 11. In some embodiments, the multiple word lines are disposed across the multiple bit line structures. In some embodiments, the multiple bit line structures include bit line structures BL1, BL2 and BL3 arranged in parallel and extending in a y-axis direction of FIG. 3. In some embodiments, the multiple word line structures include word line structures WL1, WL2 and WL3 arranged in parallel and extending in an x-axis direction of FIG. 3.

FIGS. 4 to 19 are schematic cross-sectional diagrams along a line A-A' shown in FIG. 3 illustrating various fabrication stages constructed according to the method S1 for manufacturing a semiconductor structure similar to that shown in FIG. 1 in accordance with some embodiments of the present disclosure. FIGS. 20 to 29 are schematic cross-sectional diagrams along a line B-B' shown in FIG. 3 illustrating various fabrication stages constructed according to the method S1 for manufacturing a semiconductor structure similar to that shown in FIG. 1 in accordance with some embodiments of the present disclosure. The stages shown in FIGS. 4 to 19 and FIGS. 20 to 29 are also illustrated schematically in the process flow in FIG. 1. In the subsequent discussion, the fabrication stages shown in FIGS. 4 to 19 and FIGS. 20 to 29 are discussed in reference to the process steps in FIG. 2.

Figure 4:
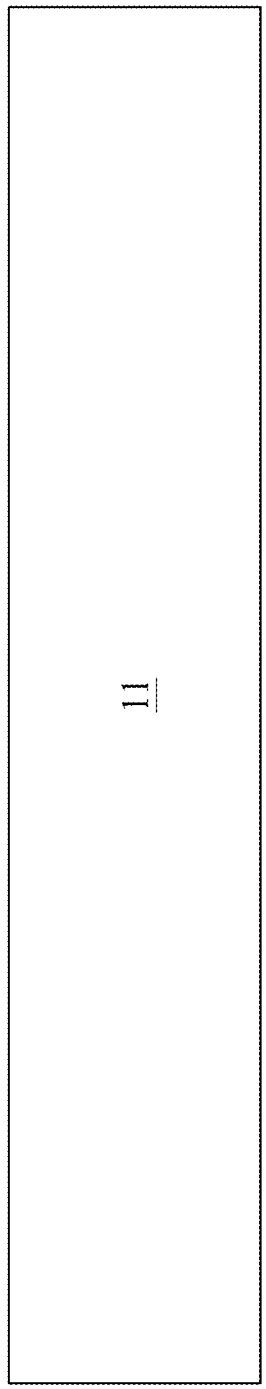
FIGS. 4 to 20 are cross-sectional diagrams of intermediate stages along a line A-A' shown in FIG. 3 in the formation of a semiconductor structure in accordance with some embodiments of the present disclosure.

Referring to FIG. 4, FIG. 4 is a schematic cross-sectional diagram along the line A-A' at a stage of the method S1 in accordance with some embodiments of the present disclosure. In the operation S11, a substrate 11 is provided, received, or formed. In some embodiments, the substrate 11 may have a multilayer structure, or the substrate 11 may include a multilayer compound semiconductor structure. In some embodiments, the substrate 11 includes semiconductor devices, electrical components, electrical elements or a combination thereof. In some embodiments, the substrate 11 includes transistors or functional units of transistors. In some embodiments, the substrate 11 includes active components, passive components, and/or conductive elements.

In some embodiments, the substrate 11 is similar to that shown in FIG. 1. The substrate 11 can be formed following a conventional method for forming a semiconductor substrate.

Figure 5:
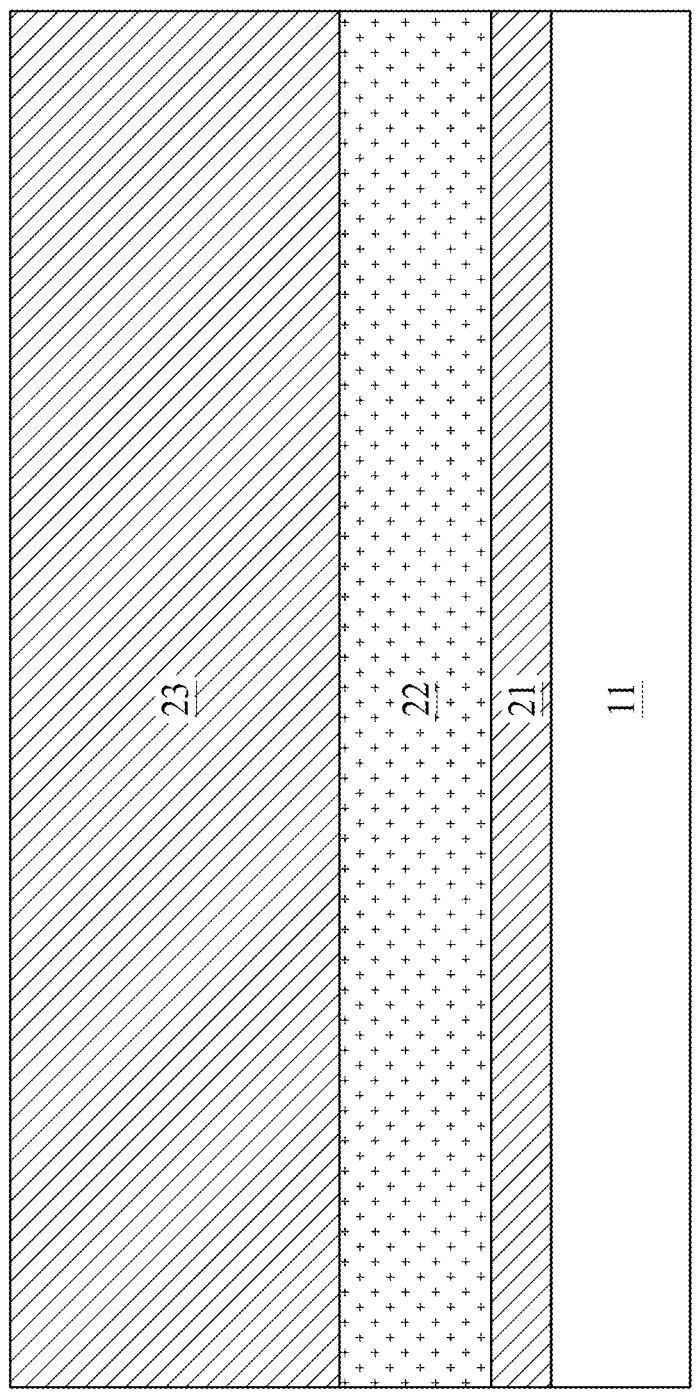
Figure 6:
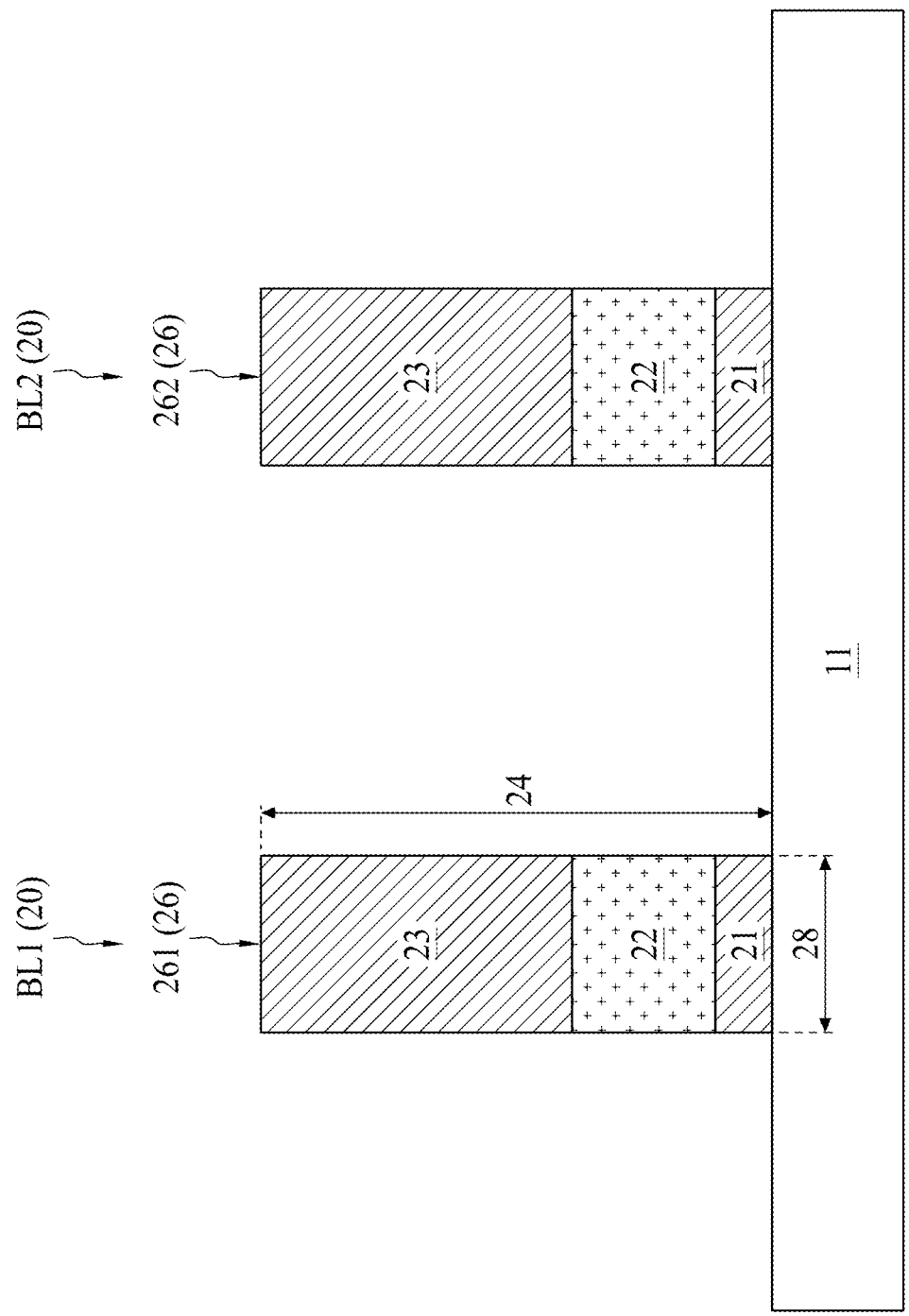

Referring to FIGS. 5 and 6, FIGS. 5 and 6 are schematic cross-sectional diagrams along the line A-A' at different stages of the method S1 in accordance with some embodiments of the present disclosure. In some embodiments, the operation S12 is performed after the operation S11 and includes multiple steps.

Referring to FIG. 5, FIG. 5 is a schematic cross-sectional diagram along the line A-A' at a stage of the method S1 in accordance with some embodiments of the present disclosure. After the operation S11, multiple layers can be formed over the substrate 11. In some embodiments, a first dielectric layer 21, a conductive layer 22, and a second dielectric layer 23 are sequentially formed over the substrate 11. In some embodiments, a thickness of the second dielectric layer 23 is greater than a thickness of the conductive layer 22. In some embodiments, the thickness of the conductive layer 22 is greater than a thickness of the first dielectric layer 21.

In some embodiments, each of the first dielectric layer 21 and the second dielectric layer 23 includes one or more dielectric materials. In some embodiments, the dielectric material includes a polymeric material, an organic material, an inorganic material, a photoresist material or a combination thereof. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure. In some embodiments, the dielectric material includes silicon oxide ($SiO_x$), silicon nitride ($Si_xN_y$), silicon oxynitride (SiON), metallic nitride or a combination thereof. In some embodiments, the first dielectric layer 21 or the second dielectric layer 23 includes silicon nitride, metallic nitride, or a combination thereof. In some embodiments, the second dielectric layer 23 includes a nitride material same as a material of the first dielectric layer 21. In some embodiments, the first dielectric layer 21 or the second dielectric layer 23 is formed by a blanket deposition. In some embodiments, the first dielectric layer 21 or the second dielectric layer 23 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

In some embodiments, the conductive layer 22 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), other applicable conductive materials, oxides of the above-mentioned metals, or a combination thereof. In some embodiments, the conductive layer 22 include tungsten. In some embodiments, the conductive layer 22 is formed by CVD, PVD, a sputtering operation, an electroplating operation, an electroless-plating operation, or a combination thereof. In some embodiments, the first dielectric layer 21 covers an entirety of the substrate 11. In some embodiments, the conductive layer 22 covers an entirety of the first dielectric layer 21. In some embodiments, the second dielectric layer 23 covers an entirety of the conductive layer 22.

Referring to FIG. 6, FIG. 6 is a schematic cross-sectional diagram along the line A-A' at a stage of the method S1 in accordance with some embodiments of the present disclosure. After the formation of the first dielectric layer 21, the conductive layer 22 and the second dielectric layer 23, a patterning operation is performed on the first dielectric layer 21, the conductive layer 22 and the second dielectric layer 23 to form one or more bit line structures 20. In some embodiments, the bit line structures 20 include a bit line structure BL1 and a bit line structure BL2. It should be noted that the bit line structures BL1 and BL2 are for a purpose of illustration only. More bit line structures 20 can be formed by the patterning operation, and a number of the bit line structures 20 is not limited herein.

In some embodiments, the patterning operation for forming the bit line structures BL1 and BL2 can include one or more etching operations. In some embodiments, the etching operation includes a wet etching operation, a dry etching operation, or a combination thereof. In some embodiments, the etching operation includes a selective wet etching, a directional dry etching, an ion beam etching, a reactive ion etching, or a combination thereof. In some embodiments, an etching operation having a low selectivity to the materials of the first dielectric layer 21, the conductive layer 22 and the second dielectric layer 23 is performed, and the first dielectric layer 21, the conductive layer 22 and the second dielectric layer 23 are patterned concurrently by one etching operation. In some embodiments, a sequence of etching operations targeting the first dielectric layer 21, the conductive layer 22 and the second dielectric layer 23 respectively is performed, and the first dielectric layer 21, the conductive layer 22 and the second dielectric layer 23 are patterned individually by different etching operations. In some embodiments, a first etching operation having a high selectivity to the second dielectric layer 23 is performed until an exposure of the conductive layer 22 occurs. In some embodiments, a second etching operation having a high selectivity to the conductive layer 22 is performed until an exposure of the first dielectric layer 21 occurs. In some embodiments, a third etching operation having a high selectivity to the first dielectric layer 21 is performed until an exposure of the substrate 11 occurs.

In some embodiments, a photoresist layer (not shown) is formed prior to the patterning operation. In some embodiments, the photoresist layer is configured to define the bit line structures BL1 and BL2. In some embodiments, after the formation of the second dielectric layer 23, pre-cleaning, photoresist application (formation of the photoresist layer), exposure, developing and etching are sequentially performed to form the bit line structures BL1 and BL2. In some embodiments, when the patterning operation includes multiple etching operations, the same photoresist layer can be used in all the etching operations (e.g., the first etching operation, the second etching operation and the third etching operation). In some embodiments, the photoresist layer is removed to form the intermediate structure as shown in FIG. 6. In some embodiments, a height 24 of the bit line structure BL1 is substantially equal to a total thickness of the first dielectric layer 21, the conductive layer 22 and the second dielectric layer 23 as shown in FIG. 5. In some embodiments, a height of the bit line structure BL2 is substantially equal to the height 24. Therefore, the numeral 24 can represent the heights of both of the bit line structures BL1 and BL2. In some embodiments, all the bit line structures 20 may have the same height 24, and the height 24 can represent the heights of each of the bit line structures 20. In some embodiments, a width of the bit line structure BL2 is substantially equal to a width 28 of the bit line structure BL1. Therefore, the numeral 28 can represent the widths of both of the bit line structures BL1 and BL2. In some embodiments, all the bit line structures 20 may have the same width 28, and the width 28 can represent the widths of each of the bit line structures 20. In some embodiments, a top surface 261 of the bit line structure BL1 is substantially aligned with or coplanar with a top surface 262 of the bit line structure BL2. In some embodiments, the top surfaces 261 and 262 together define a top surface 26 of the bit line structures 20.

Figure 7:
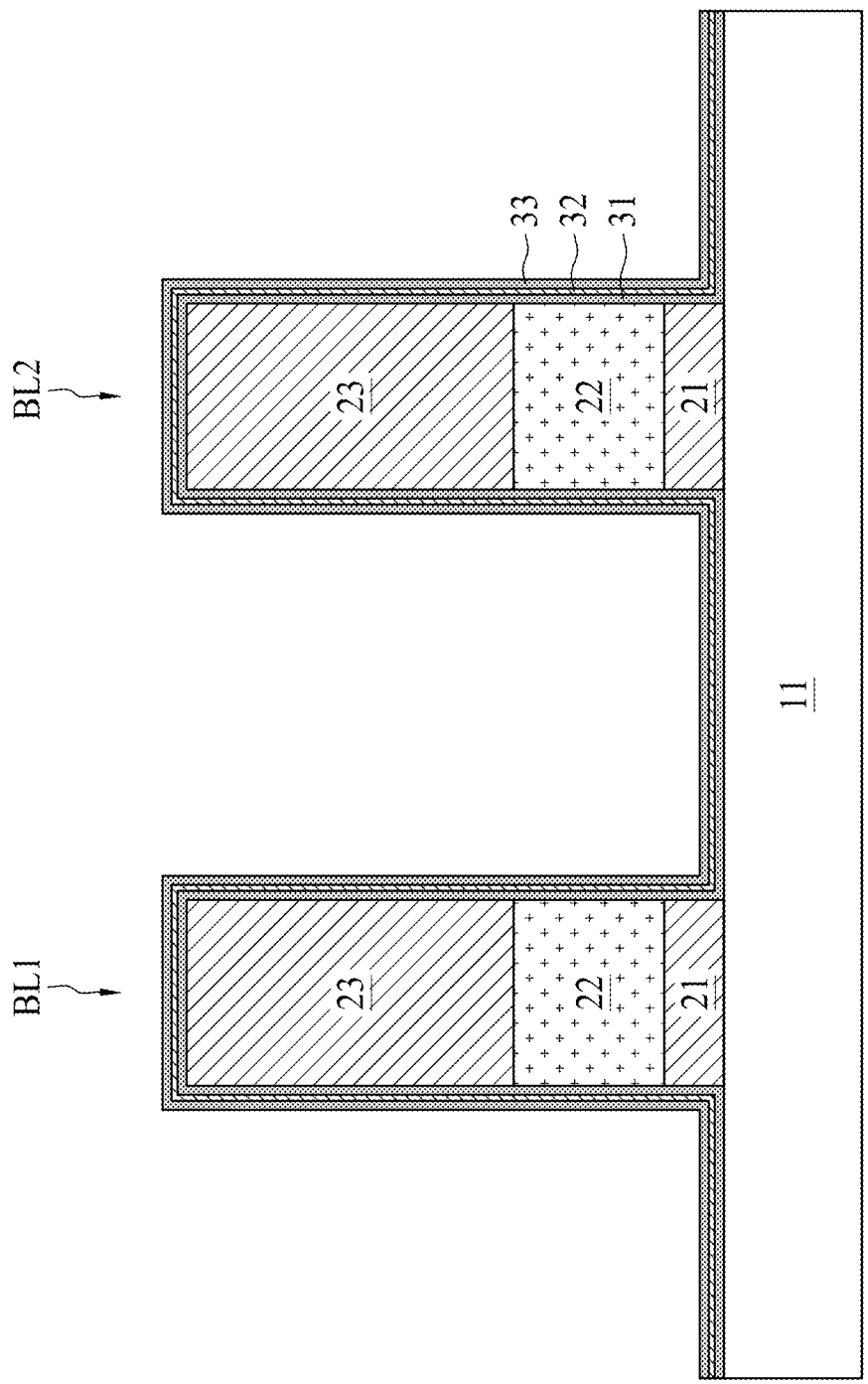
Figure 8:
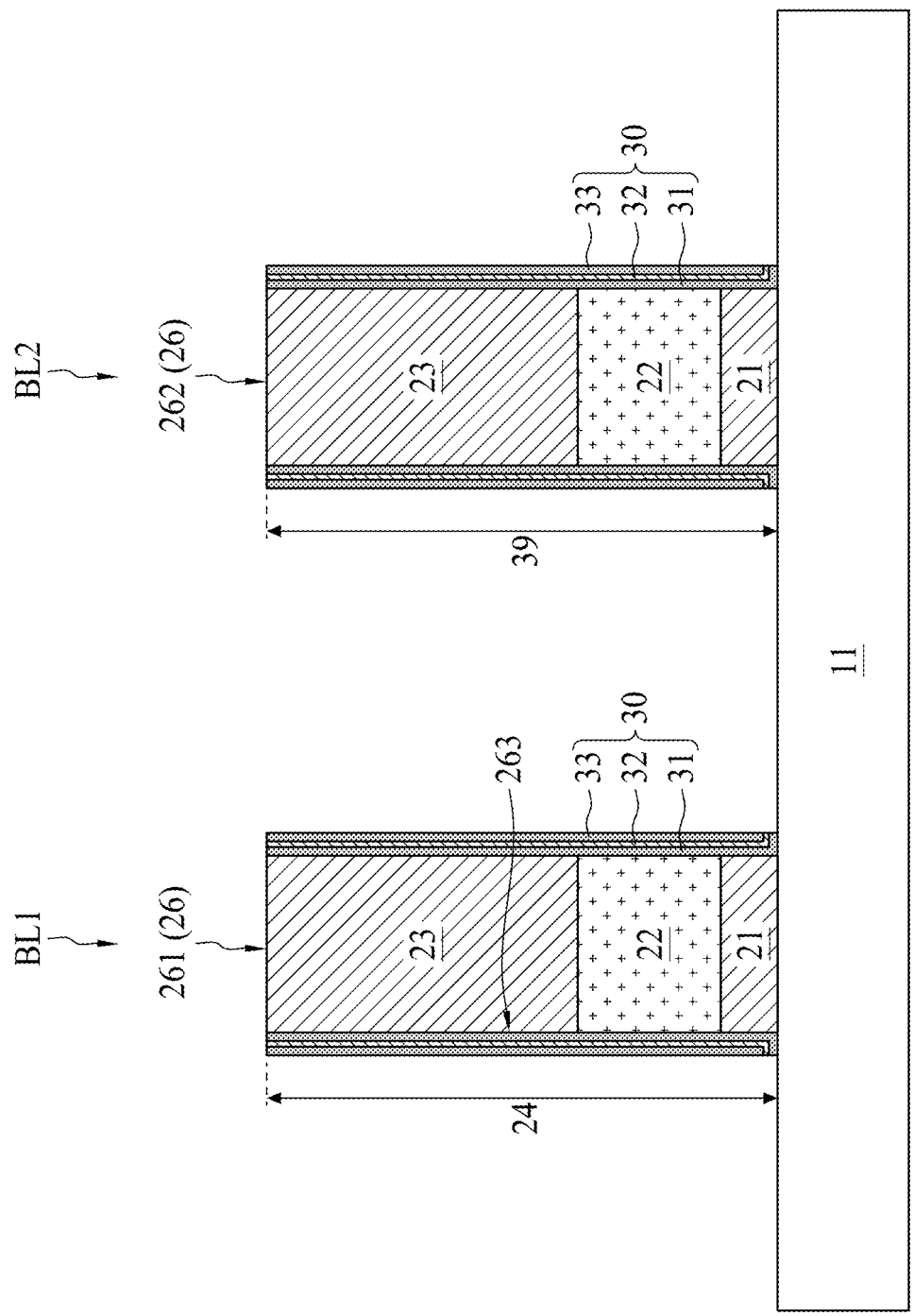

Referring to FIGS. 7 and 8, FIGS. 7 and 8 are schematic cross-sectional diagrams along the line A-A' at different stages of the method S1 in accordance with some embodiments of the present disclosure. In some embodiments, the operation S13 is performed after the operation S12 and includes multiple steps.

Referring to FIG. 7, FIG. 7 is a schematic cross-sectional diagram along the line A-A' at a stage of the method S1 in accordance with some embodiments of the present disclosure. After the formation of the bit line structures BL1 and BL2, one or more conformal layers are formed over the bit line structures BL1 and BL2 and the substrate 11. In some embodiments, each of the conformal layers includes a dielectric material, and two adjacent conformal layers may include different dielectric materials. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the multiple conformal layers include a first nitride layer 31, a second nitride layer 33, and an oxide layer 32 between the first nitride layer 31 and the second nitride layer 33 as shown in FIG. 7. In some embodiments, a profile of each of the first nitride layer 31, the oxide layer 32 and the second nitride layer 33 is conformal to a profile of the bit line structures BL1 and BL2 and the substrate 11. In some embodiments, the first nitride layer 31, the oxide layer 32 and the second nitride layer 33 are individually formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, each of the first nitride layer 31, the oxide layer 32 and the second nitride layer 33 is formed by a conformal deposition. In some embodiments, a thickness of the first nitride layer 31 is substantially equal to a thickness of the second nitride layer 33. In some embodiments, a thickness of the oxide layer 32 is less than that of the first nitride layer 31 or the second nitride layer 33. In some embodiments, the first nitride layer 31 and the second nitride layer 33 include a same nitride material. In some embodiments, the oxide layer 32 includes silicon oxide. In some embodiments, the first nitride layer 31 or the second nitride layer 33 includes silicon nitride.

Referring to FIG. 8, FIG. 8 is a schematic cross-sectional diagram along the line A-A' at a stage of the method S1 in accordance with some embodiments of the present disclosure. After the formation of the conformal layers (e.g., the first nitride layer 31, the oxide layer 32 and the second nitride layer 33), horizontal portions of the conformal layers are removed to form multiple spacers 30 surrounding each of the bit line structures (e.g., the bit line structures BL1 and BL2). In some embodiments, the removal of the horizontal portions of the conformal layers includes a wet etching operation, a dry etching operation, or a combination thereof performed to form the spacers 30. In some embodiments, the removal of the horizontal portions of the conformal layers includes a selective wet etching, a directional dry etching, an ion beam etching, a reactive ion etching, or a combination thereof.

In some embodiments, the horizontal portions of the second nitride layer 33, the horizontal portions of the oxide layer 32, and the horizontal portions of the first nitride layer 31 are concurrently removed by one etching operation. In some embodiments, the horizontal portions of the second nitride layer 33, the horizontal portions of the oxide layer 32, and the horizontal portions of the first nitride layer 31 are individually removed by separate etching operations. The removal of the horizontal portions of the second nitride layer 33, the oxide layer 32 and the first nitride layer 31 by multiple etching operations can be similar to the multiple etching operations of the formation of the bit line structures BL1 and BL2, and repeated description is omitted herein. In some embodiments, the spacer 30 surrounds sidewalls 263 of the bit line structures BL1 and BL2 as shown in FIG. 8. In some embodiments, the top surface 261 of the bit line structure BL1 or the top surface 262 of the bit line structure BL2 is exposed through a corresponding spacer 30. In some embodiments, a height 39 of the spacer 30 is substantially equal to the height 24 of the bit line structures BL1 and BL2.

Figure 9:
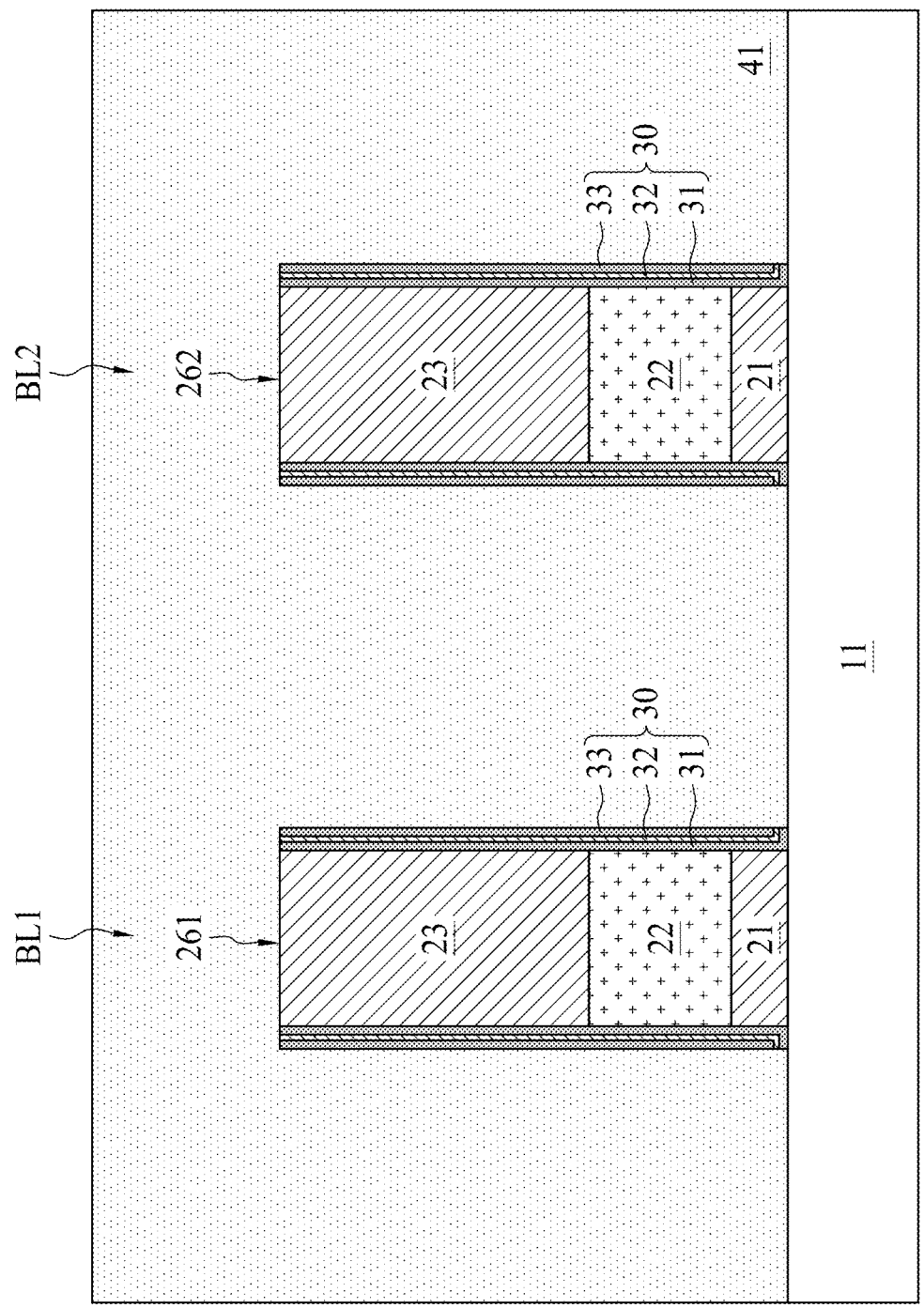

Referring to FIG. 9, FIG. 9 is a schematic cross-sectional diagram along the line A-A' at a stage of the method S1 in accordance with some embodiments of the present disclosure. After the formation of the spacers 30, a polysilicon layer 41 is formed in the operation S14. In some embodiments, the polysilicon layer 41 is formed by a blanket deposition. In some embodiments, the blanket deposition includes a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the polysilicon layer 41 covers the top surfaces 261 and 262 of the bit line structures BL1 and BL2. In some embodiments, a height of the polysilicon layer 41 shown in FIG. 9 includes a height substantially greater than the height 24 of the bit line structure BL1 or BL2.

Figure 10:
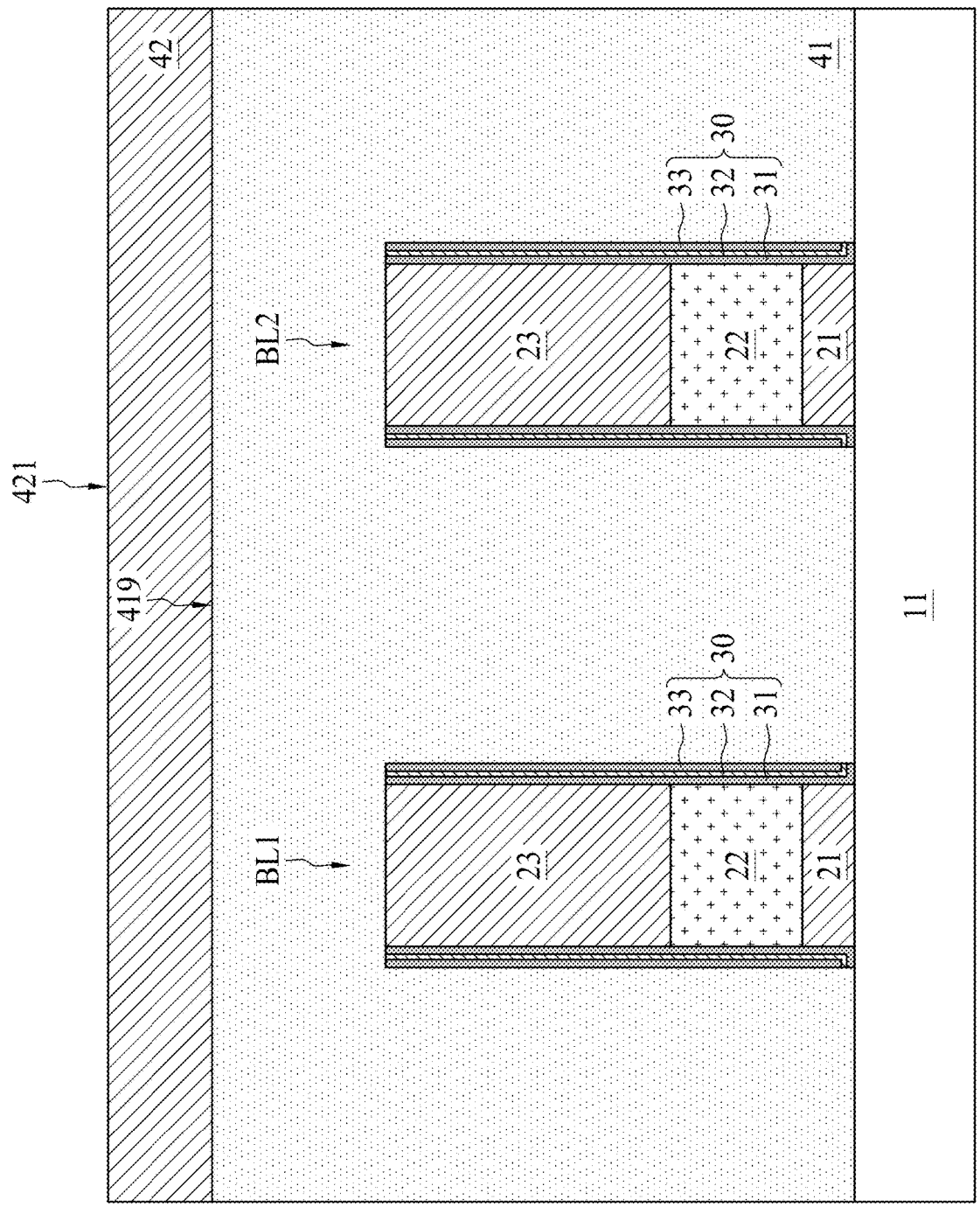

Referring to FIG. 10, FIG. 10 is a schematic cross-sectional diagram along the line A-A' at a stage of the method S1 in accordance with some embodiments of the present disclosure. After the deposition of the polysilicon layer 41, a sacrificial layer 42 is formed over the polysilicon layer 41. In some embodiments, the sacrificial layer 42 at least covers a top surface 419 of the polysilicon layer 41. It should be noted that FIG. 10 shows only a portion of the polysilicon layer 41, and the top surface 419 of the polysilicon layer 41 may not be a planar surface. The sacrificial layer 42 is configured to provide a planar surface for an etching or polishing operation to be performed in the subsequent processing in order to provide a better result of planarization. In some embodiments, the sacrificial layer 42 has a top surface 421, and the top surface 421 is a planar surface. The sacrificial layer 42 is for a purpose of compensation of uneven portions of the top surface 419 of the polysilicon layer 41. In some embodiments, the sacrificial layer 41 includes a dielectric material, an anti-reflective coating material, an oxide-containing material, or other suitable materials. In some embodiments, the sacrificial layer 42 includes silicate glass, silicon oxide, silane oxide, or a combination thereof. In some embodiments, the sacrificial layer 42 includes borophosphosilicate glass (BPSG). In some embodiments, the sacrificial layer 42 includes a dielectric material different from that of the second dielectric layer 23 of the bit line structures BL1 and BL2. In some embodiments, the sacrificial layer 42 includes a dielectric material different from that of the second nitride layer 33 of the spacers 30. In some embodiments, the sacrificial layer 42 includes silicon.

Figure 11:
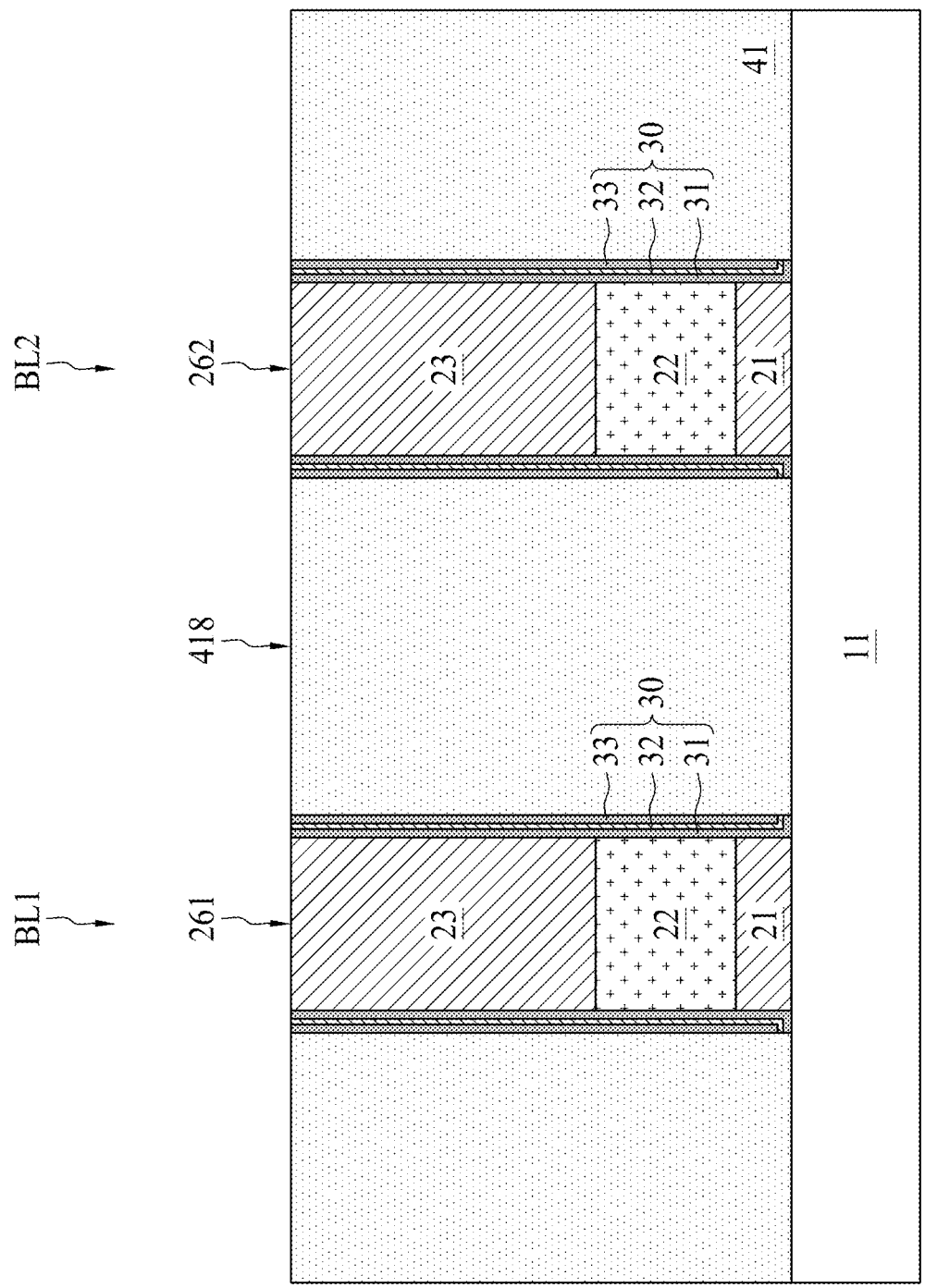

Referring to FIG. 11, FIG. 11 is a schematic cross-sectional diagram along the line A-A' at a stage of the method S1 in accordance with some embodiments of the present disclosure. After the formation of the sacrificial layer 42, a planarization is performed on the sacrificial layer 42 and the polysilicon layer 41. In some embodiments, the planarization includes ion beam etching, directional dry etching, reactive ion etching, solution wet etching, chemical mechanical polishing (CMP), or a combination thereof. In some embodiments, the planarization has a high selectivity to a material of the sacrificial layer 42. In some embodiments, the planarization has a high selectivity to a material of the polysilicon layer 41. In some embodiments, the planarization has a low selectivity to a material of the second dielectric layer 23 and/or a material of the spacers 30. In some embodiments, the planarization stops at an exposure of the top surfaces 261 and 262 of the bit line structures BL1 and BL2. In some embodiments, a top surface 418 of the polysilicon layer 41 is substantially coplanar with the top surfaces 261 and 262 of the bit line structures BL1 and BL2.

Figure 12:
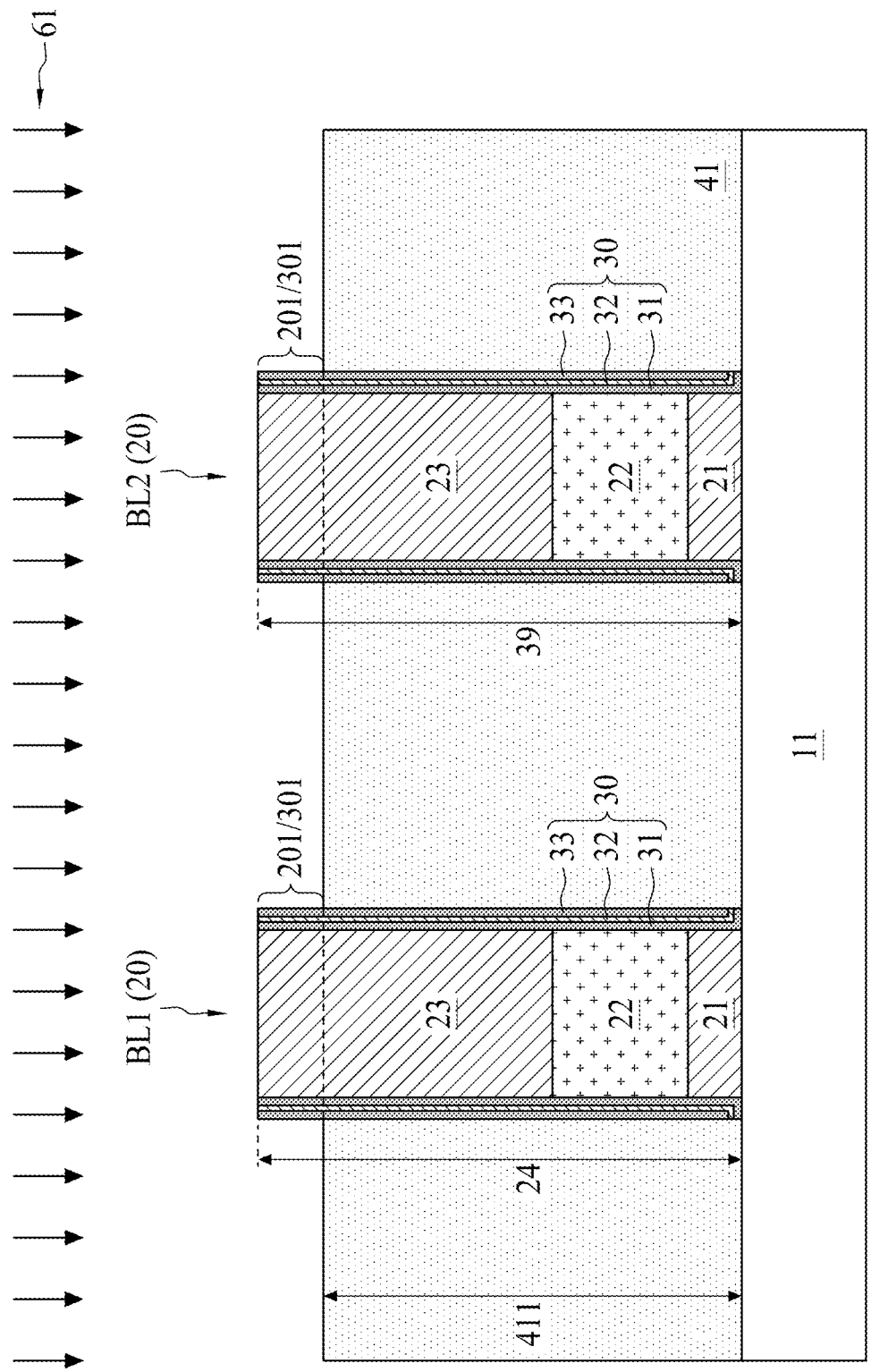

Referring to FIG. 12, FIG. 12 is a schematic cross-sectional diagram along the line A-A' at a stage of the method S1 in accordance with some embodiments of the present disclosure. In the operation S15, a first etching operation 61 is performed on the polysilicon layer 41. In some embodiments, a first height 411 of the polysilicon layer 41 is obtained after the first etching operation 61, wherein the first height 411 is less than the height 24 of the bit line structures 20 or the height 39 of the spacer 30. In some embodiments, a first portion 201 of each of the bit line structures 20 protrudes from and is exposed through the polysilicon layer 41 after the first etching operation 61. In some embodiments, a first portion 301 of each of the spacers 30 surrounding a corresponding first portion 201 of the bit line structures protrudes from and is exposed through the polysilicon layer 41 after the first etching operation 61. It should be noted that the processing of the bit line structures BL1 and BL2 can be simultaneous, and changes in configurations of the bit line structures BL1 and BL2 can be similar or the same. Therefore, for a purpose of illustration, descriptions of operations of the method S1 focus only on the bit line structure BL1 in the following illustration. Details of operations on the bit line structure BL2 are omitted herein for a purpose of brevity. However, such omission is not intended to limit the present disclosure.

The first etching operation 61 may target the polysilicon layer 41. In some embodiments, the first etching operation 61 includes a high selectivity to silicon, or to a material of the polysilicon layer 41. In some embodiments, the first etching operation 61 includes a low selectivity to nitride, or to a material of the second dielectric layer 23. In some embodiments, the first etching operation 61 includes a low selectivity to nitride and oxide, or to materials of the spacer 30. In some embodiments, the first portion 201 of the bit line structure BL1 is disposed above the polysilicon layer 41 after the first etching operation 61. In some embodiments, the first portion 301 of the spacer 30 is disposed above the polysilicon layer 41 after the first etching operation 61. In some embodiments, the first etching operation 61 is a time-mode etching operation. In some embodiments, a time duration of the first etching operation 61 is in a range of 1 to 20 seconds. In some embodiments, the time duration of the first etching operation 61 is in a range of 3 to 10 seconds.

Figure 13:
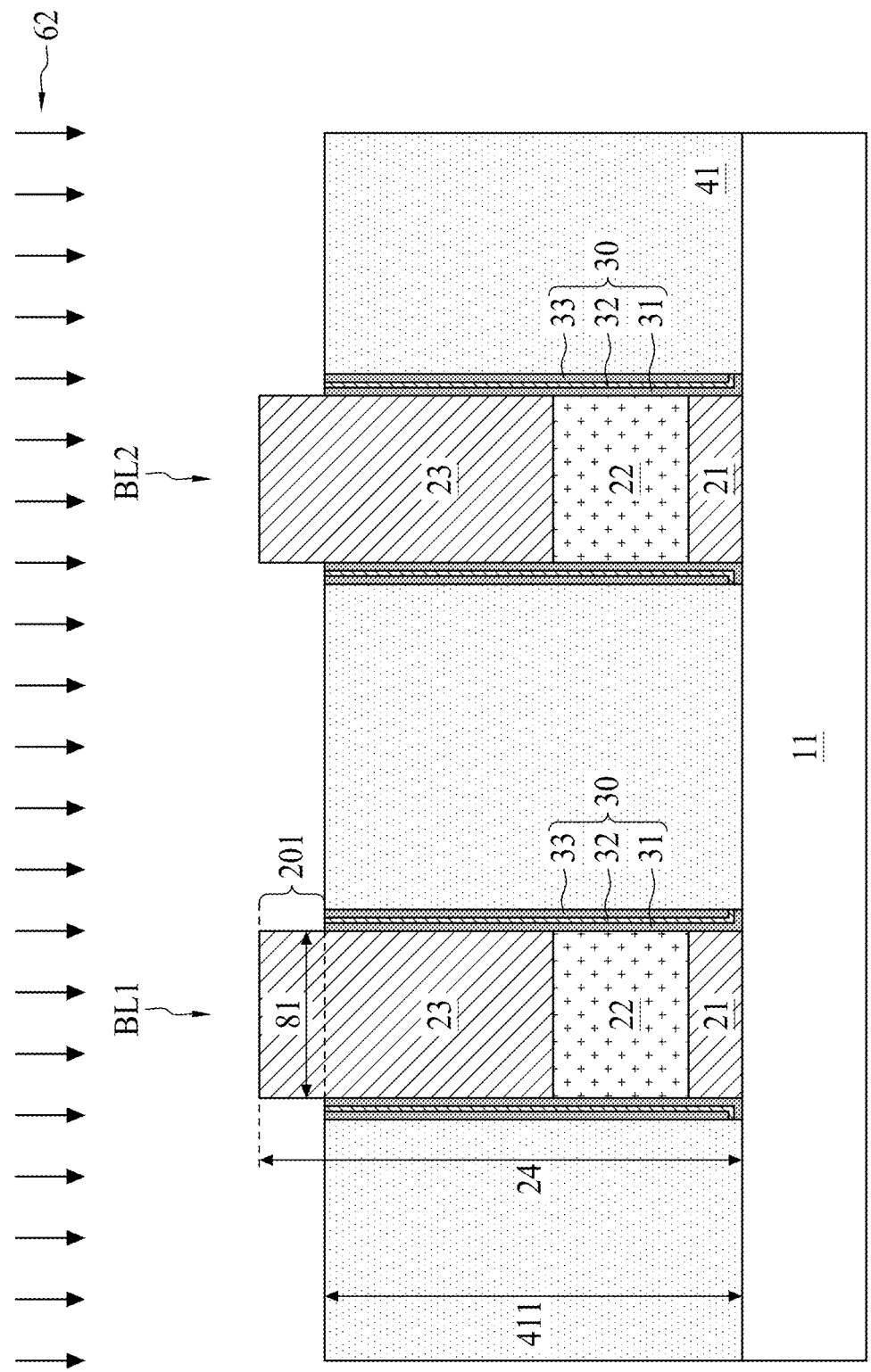

Referring to FIG. 13, FIG. 13 is a schematic cross-sectional diagram along the line A-A' at a stage of the method S1 in accordance with some embodiments of the present disclosure. In the operation S16, a second etching operation 62 is performed on the first portion 301 of the spacer 30 as shown in FIG. 13. In some embodiments, the first portion 301 of the spacer 30 is removed by the second etching operation 62. In some embodiments, sidewalls of the first portion 201 of the bit line structure BL1 are exposed after the second etching operation 62. In some embodiments, the second etching operation 62 is controlled to remove only the first portion 301 of the spacer 30. In other words, a height of the bit line structure BL1 remains consistent during the second etching operation 62. In some embodiments, the height of the bit line structure BL1 after the second etching operation 62 is substantially equal to the height 24 as shown in FIG. 12. In some embodiments, a width 81 of the first portion 201 of the bit line structure BL1 is substantially equal to the width 28 of the bit line structure BL1 shown in FIG. 6. In some embodiments, a slight portion of the first portion 201 of the bit line structure BL1 is removed by the second etching operation 62. In some embodiments, the width 81 of the first portion 201 of the bit line structure BL1 is slightly less than the width 28 of the bit line structure BL1 shown in FIG. 6.

In some embodiments, an etching rate of the second etching operation 62 on nitride is less than 1 nanometer per second (nm/s). In some embodiments, an etching gas of the second etching operation 62 includes trifluoromethane ($CHF_3$), oxide ($O_2$), or a combination thereof. In some embodiments, an etching rate of the first etching operation 61 is greater than the etching rate of the second etching operation 62. In some embodiments, the second etching operation 62 is a time-mode etching operation. In some embodiments, a time duration of the second etching operation 62 is in a range of 1 to 20 seconds. In some embodiments, the time duration of the second etching operation 62 is in a range of 3 to 10 seconds.

Figure 14:
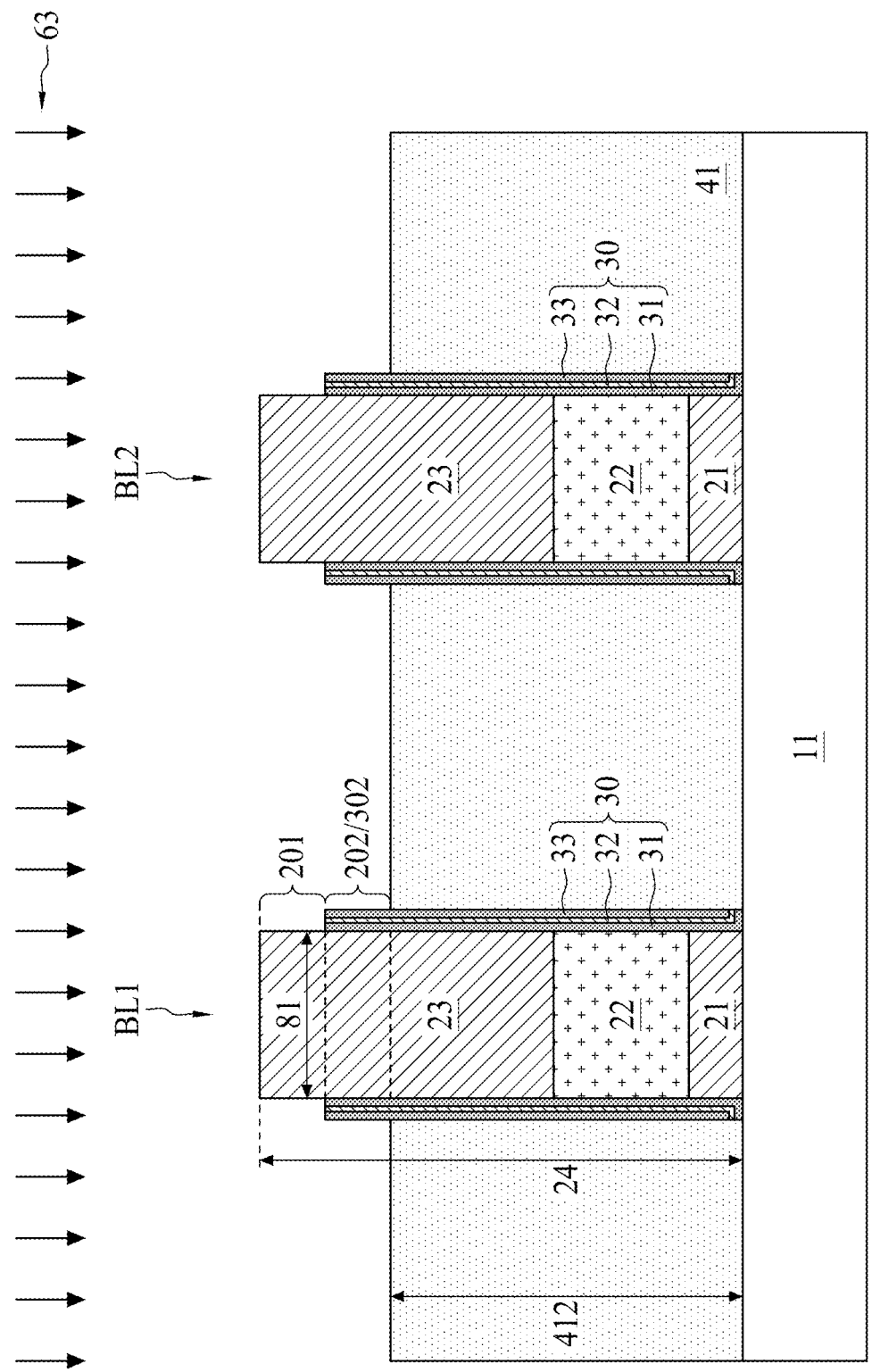

Referring to FIG. 14, FIG. 14 is a schematic cross-sectional diagram along the line A-A' at a stage of the method S1 in accordance with some embodiments of the present disclosure. In the operation S17, a third etching operation 63 is performed on the polysilicon layer 41 shown in FIG. 13 to obtain a second height 412 of the polysilicon layer 41, wherein the second height 412 is less than the first height 411. In some embodiments, a second portion 202 of the bit line structure BL1 protrudes from and is exposed through the polysilicon layer 41 after the third etching operation 63. In some embodiments, the second portion 202 of the bit line structure BL1 is disposed below the first portion 201 and above the polysilicon layer 41. In some embodiments, a second portion 302 of the spacer 30 surrounding the second portion 202 of the bit line structure BL1 protrudes from and is exposed through the polysilicon layer 41 after the third etching operation 63. In some embodiments, the second portion 302 of the spacer 30 is disposed below the first portion 301 and above the polysilicon layer 41.

The third etching operation 63 may be similar to the first etching operation 61. In some embodiments, the third etching operation 63 includes a high selectivity to silicon, or to a material of the polysilicon layer 41. In some embodiments, the third etching operation 63 includes a low selectivity to nitride, or to a material of the second dielectric layer 23. In some embodiments, the third etching operation 63 includes a low selectivity to nitride and oxide, or to materials of the spacer 30. In some embodiments, the third etching operation 63 is a time-mode etching operation. In some embodiments, a time duration of the third etching operation 63 is in a range of 1 to 20 seconds. In some embodiments, the time duration of the third etching operation 63 is in a range of 3 to 10 seconds. In some embodiments, the time duration of the third etching operation 63 is substantially equal to the time duration of the first etching operation 61, and thus reductions in the heights of the polysilicon layer 41 by the first etching operation 61 and the third etching operation 63 are substantially equal. In other words, a difference between the height 24 and the height 411 shown in FIG. 12 is substantially equal to a difference between the heights 411 and 412 shown in FIGS. 13 and 14.

Figure 15:
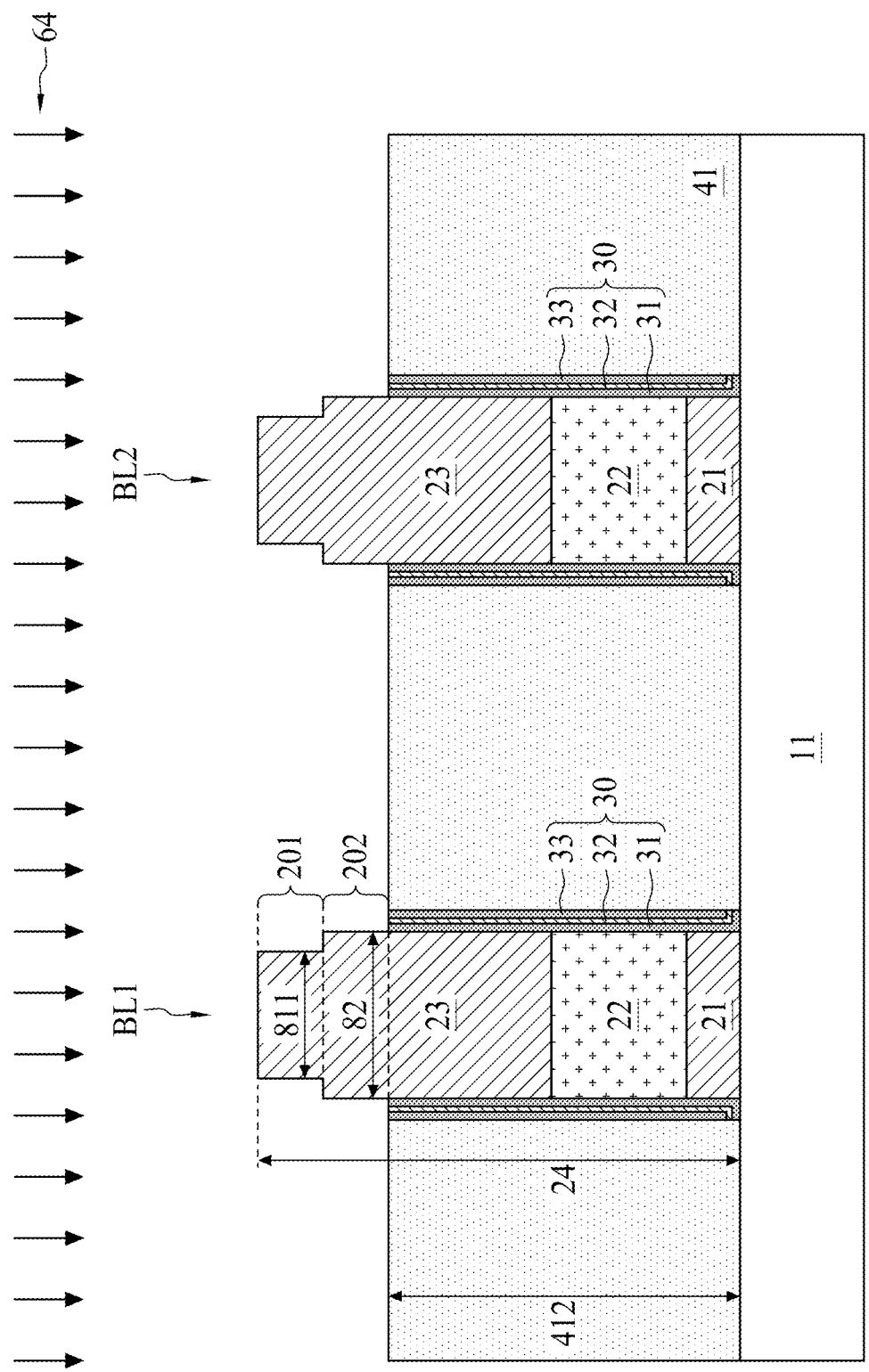

Referring to FIG. 15, FIG. 15 is a schematic cross-sectional diagram along the line A-A' at a stage of the method S1 in accordance with some embodiments of the present disclosure. After the operation S17, the method S1 may further include a fourth etching operation 64. The fourth etching operation 64 may be performed on or targeted to the bit line structures 20 and the spacers 30. In some embodiments, a width of the first portion 201 is reduced from the width 81 shown in FIG. 14 to a width 811 as shown in FIG. 15, wherein the width 811 is less than the width 81. In some embodiments, the second portion 302 of the spacer 30 in FIG. 14 is removed by the fourth etching operation 64. In some embodiments, sidewalls of the second portion 202 of the bit line structure BL1 are exposed after the fourth etching operation 64.

The fourth etching operation 64 may be similar to the second etching operation 62. In some embodiments, the fourth etching operation 64 is controlled to remove only lateral portions of the second portion 202 of the bit line structure BL1 and the second portion 302 of the spacer 30. In other words, a height of the bit line structure BL1 remains consistent during the fourth etching operation 64. In some embodiments, the height of the bit line structure BL1 after the fourth etching operation 64 is substantially equal to the height 24 as shown in FIG. 14. In some embodiments, a width 82 of the second portion 202 of the bit line structure BL1 is substantially equal to the width 28 of the bit line structure BL1 shown in FIG. 6. In some embodiments, a slight portion of the second portion 202 of the bit line structure BL1 is removed by the fourth etching operation 64. In some embodiments, the width 82 of the second portion 202 of the bit line structure BL1 is slightly less than the width 28 of the bit line structure BL1 shown in FIG. 6. In some embodiments, the width 82 is greater than the width

811. In some embodiments, an etching rate of the fourth etching operation 64 on nitride is less than 1 nanometer per second (nm/s). In some embodiments, an etching gas of the fourth etching operation 64 includes trifluoromethane (CHF$_3$), oxide (O$_2$), or a combination thereof. In some embodiments, the fourth etching operation 64 is a time-mode etching operation. In some embodiments, a time duration of the fourth etching operation 64 is in a range of 1 to 20 seconds. In some embodiments, the time duration of the fourth etching operation 64 is in a range of 3 to 10 seconds. In some embodiments, the time duration of the fourth etching operation 64 is substantially equal to the time duration of the second etching operation 62.

Figure 16:
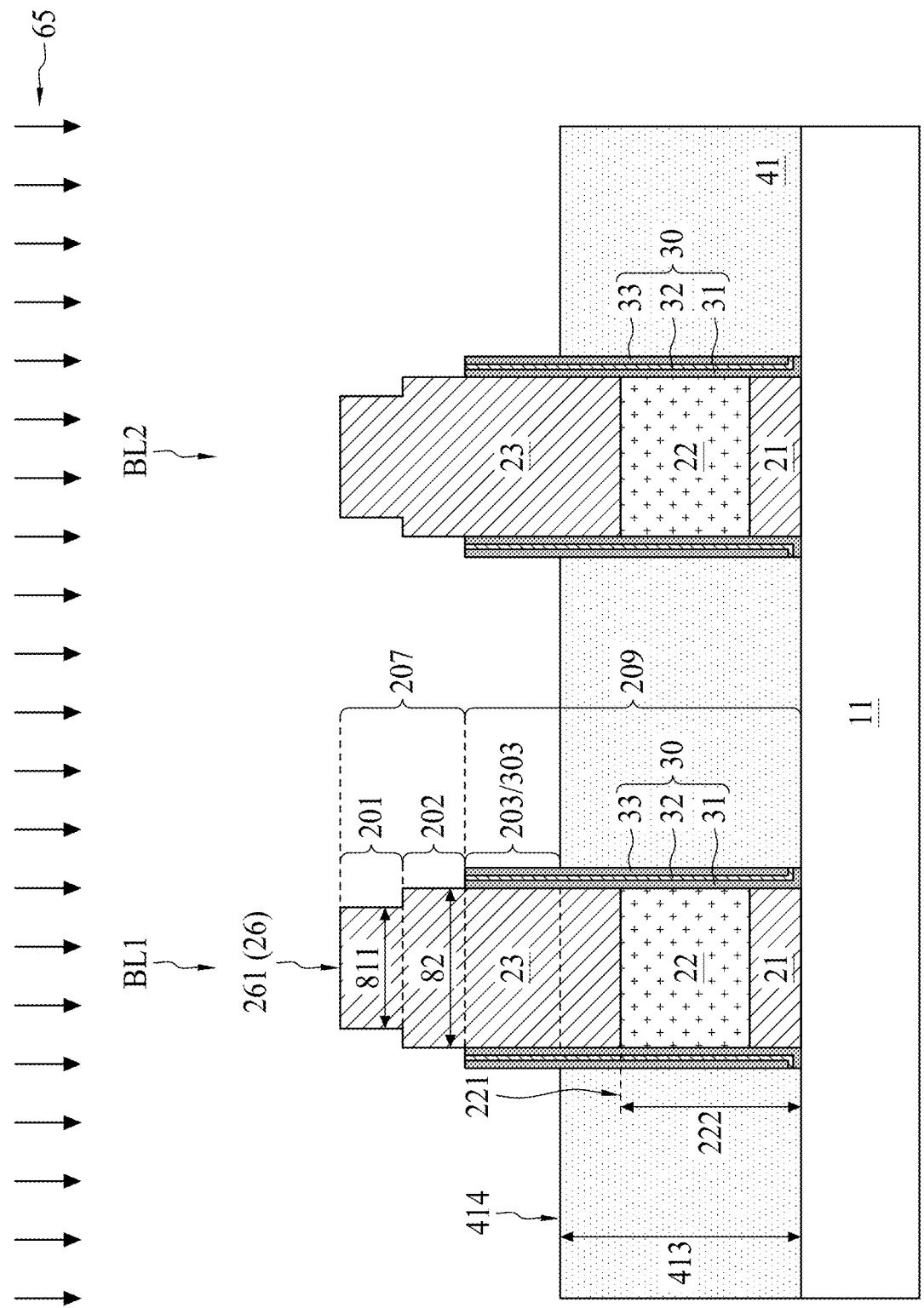

Referring to FIG. 16, FIG. 16 is a schematic cross-sectional diagram along the line A-A' at a stage of the method S1 in accordance with some embodiments of the present disclosure. After the fourth etching operation 64, the method S1 further includes a fifth etching operation 65. The fifth etching operation 65 may be performed on the polysilicon layer 41 shown in FIG. 16 to obtain a third height 413 of the polysilicon layer 41, wherein the third height 413 is less than the second height 412. In some embodiments, a third portion 203 of the bit line structure BL1 protrudes from and is exposed through the polysilicon layer 41 after the fifth etching operation 65. In some embodiments, the third portion 203 of the bit line structure BL1 is disposed below the second portion 202 and above the polysilicon layer 41. In some embodiments, a third portion 303 of the spacer 30 surrounding the third portion 203 of the bit line structure BL1 protrudes from and is exposed through the polysilicon layer 41 after the fifth etching operation 65. In some embodiments, the third portion 303 of the spacer 30 is disposed below the second portion 302 and above the polysilicon layer 41.

The fifth etching operation 65 may be similar to the third etching operation 63 and/or the first etching operation 61. In some embodiments, the fifth etching operation 65 includes a high selectivity to silicon, or to a material of the polysilicon layer 41. In some embodiments, the fifth etching operation 65 includes a low selectivity to nitride, or to a material of the second dielectric layer 23. In some embodiments, the fifth etching operation 65 includes a low selectivity to nitride and oxide, or to materials of the spacer 30.

In some embodiments, the fifth etching operation 65 is a time-mode etching operation. In some embodiments, a time duration of the fifth etching operation 65 is in a range of 1 to 20 seconds. In some embodiments, the time duration of the fifth etching operation 65 is in a range of 3 to 10 seconds. In some embodiments, the time duration of the fifth etching operation 65 is substantially equal to the time duration of the third etching operation 63, and thus reductions in the height of the polysilicon layer 41 by the fifth etching operation 65 and the third etching operation 63 are substantially equal. In other words, a difference between the heights 411 and 412 shown in FIGS. 13 and 14 is substantially equal to a difference between the heights 412 and 413 shown in FIGS. 15 and 16. In some embodiments, the time duration of the fifth etching operation 65 is substantially greater than the time duration of the third etching operation 63, and thus the reduction in the height of the polysilicon layer 41 by the fifth etching operation 65 is substantially greater than the reduction in the height of the polysilicon layer 41 by the third etching operation 63.

The polysilicon layer 41 may at least horizontally surround or overlap an entirety of the conductive layer 22 after the fifth etching operation 65. In some embodiments, after the fifth etching operation 65, the polysilicon layer 41 is referred to as a polysilicon contact 41. In some embodiments, a top surface 414 of the polysilicon layer 41 formed after the fifth etching operation 65 is substantially aligned with or above a top surface 221 of the conductive layer 22 of the bit line structure BL1. In some embodiments, the height 413 of the polysilicon layer 41 is substantially greater than or equal to a distance 222 between the top surface 221 of the conductive layer 22 and the substrate 11. Therefore, a stepped configuration of an upper portion 207 of the bit line structure BL1 is formed above the third portion 303 of the spacer 30. In some embodiments, the upper portion 207 includes the first portion 201 and the second portion 202. In some embodiments, the upper portion 207 is tapered from a lower portion 209 toward the top surface 261 of the bit line structure BL1. In some embodiments, the lower portion 209 of the bit line structure BL1 is surrounded by the spacer 30 and retains a cylindrical configuration. In some embodiments, the width 811 is substantially greater than 12 nm.

Figure 17:
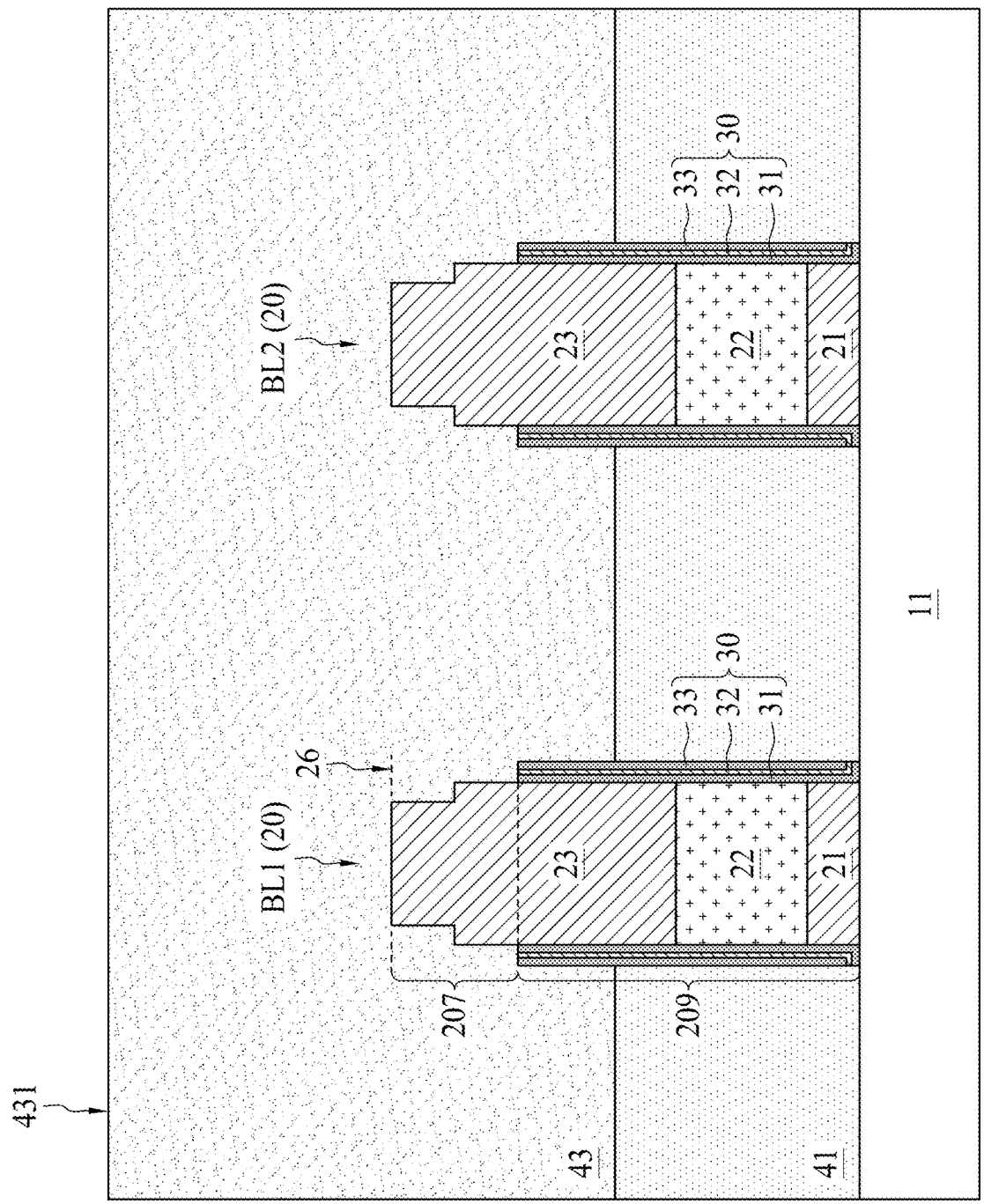

Referring to FIG. 17, FIG. 17 is a schematic cross-sectional diagram along the line A-A' at a stage of the method S1 in accordance with some embodiments of the present disclosure. After the fifth etching operation 65, the method S1 further includes forming a metal layer 43 over the polysilicon layer 41 and the bit line structures 20. In some embodiments, the metal layer 43 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the metal layer 43 includes tungsten, copper, or a combination thereof. In some embodiments, the metal layer 43 is formed by CVD, PVD, LPCVD, PECVD, a sputtering operation, electroplating, or a combination thereof. In some embodiments, the metal layer 43 at least covers the top surface 26 of the bit line structures 20. It should be noted that FIG. 17 shows only a portion of the metal layer 43, and a top surface 431 of the metal layer 43 may not be a planar surface.

Figure 18:
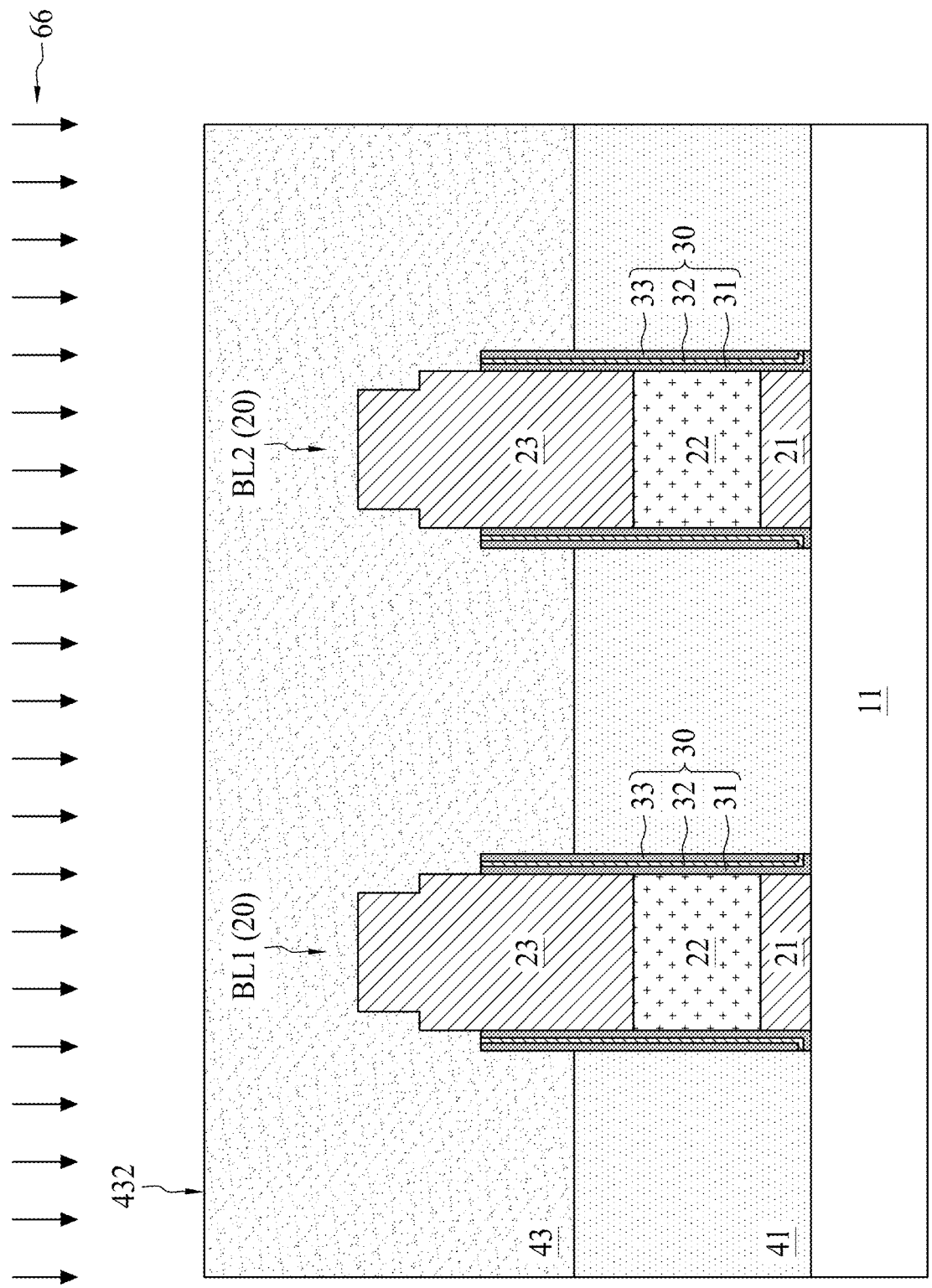

Referring to FIG. 18, FIG. 18 is a schematic cross-sectional diagram along the line A-A' at a stage of the method S1 in accordance with some embodiments of the present disclosure. After the formation of the metal layer 43, the method S1 may further include a planarization 66. In some embodiments, the planarization 66 includes ion beam etching, directional dry etching, reactive ion etching, solution wet etching, CMP, or a combination thereof. In some embodiments, the planarization 66 includes a polishing operation (e.g., a CMP operation). In some embodiments, a top surface 432 of the metal layer 43 is formed after the planarization 66. In some embodiments, the top surface 432 is a planar surface disposed at an elevation lower than the top surface 431 shown in FIG. 17.

Figure 19:
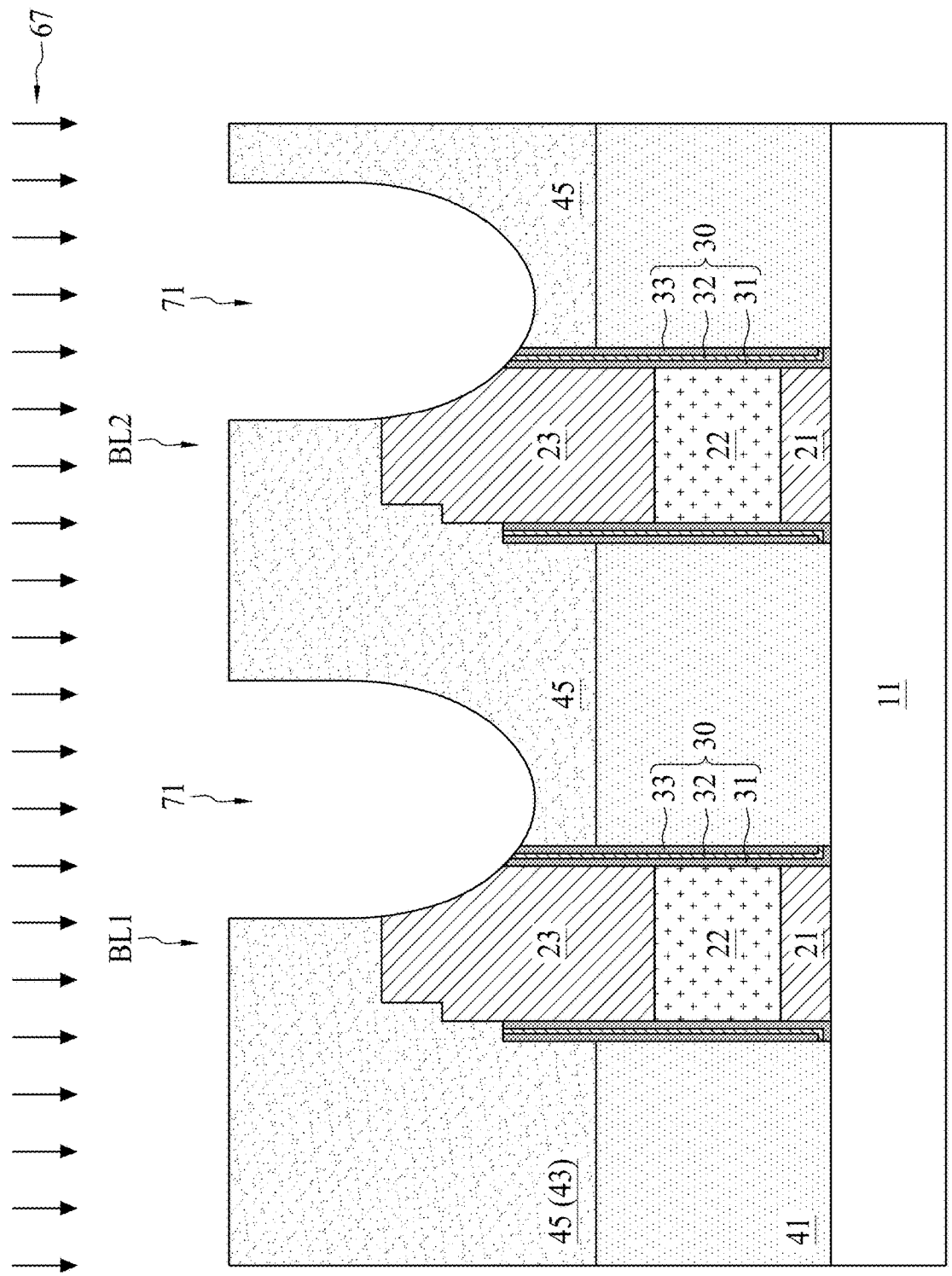

Referring to FIG. 19, FIG. 19 is a schematic cross-sectional diagram along the line A-A' at a stage of the method S1 in accordance with some embodiments of the present disclosure. After the planarization 66, the method S1 may further include an etching operation 67. In some embodiments, the etching operation 67 is performed on and targets the metal layer 43. In some embodiments, a plurality of openings 71 are formed on the metal layer 43 and thereby define a plurality of landing pads 45. In some embodiments, portions of the bit line structures 20 and portions of the spacers 30 are also removed by the etching operation 67. In some embodiments, a right corner portion of the bit line structure BL1 adjacent to the bit line structure BL2 is removed by the etching operation 67. In some embodiments, a top portion of the spacer 30 adjacent to the bit line structure BL2 is also removed by the etching operation 67. In some embodiments, the spacer 30 is exposed in the opening 71. In alternative embodiments, the etching operation 67 removes only portions of the metal layer 43. In some embodiments, configurations of the bit line structures 20 and the spacers 30 remain the same before, during and after the etching operation 67. In some embodiments, the bit line structure BL1 and the spacer 30 are exposed in the opening 71 and portions thereof are disposed in the opening 71.

Figure 20:
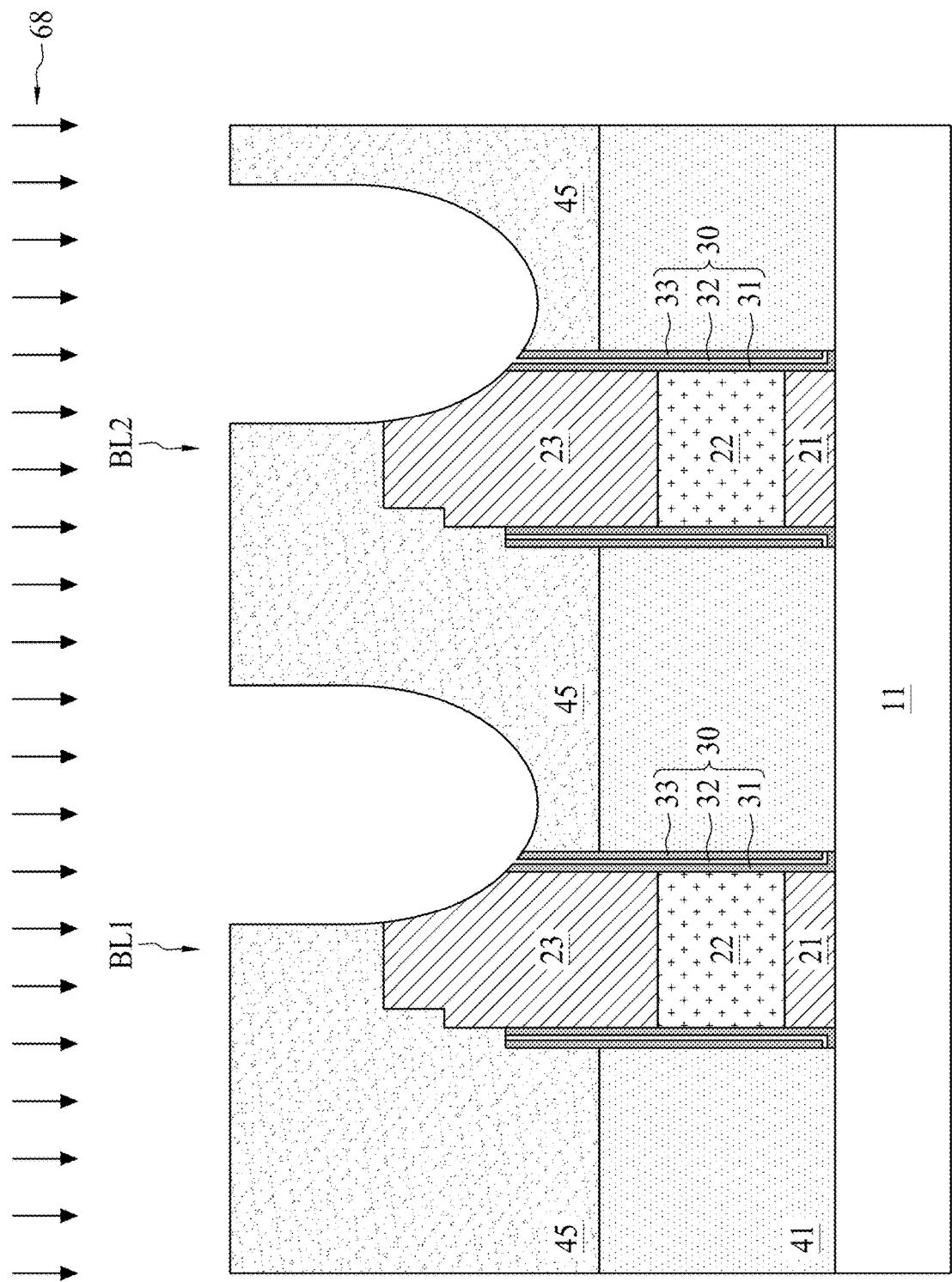

Referring to FIG. 20, FIG. 20 is a schematic cross-sectional diagram along the line A-A' at a stage of the method S1 in accordance with some embodiments of the present disclosure. After the etching operation 67, the method S1 may further include an etching operation 68. In some embodiments, the etching operation 68 is configured to remove the oxide layer 32 shown in FIG. 19. In some embodiments, an air gap 34 is thereby formed in place of the removed oxide layer 32. In some embodiments, the etching operation 68 includes vapor etching, a solution wet etching, or a combination thereof. In some embodiments, vapor-phase hydrogen fluoride (HF) is used to remove the oxide layer 32. A semiconductor structure similar to that shown in FIG. 1 is thereby formed.

Figure 21:
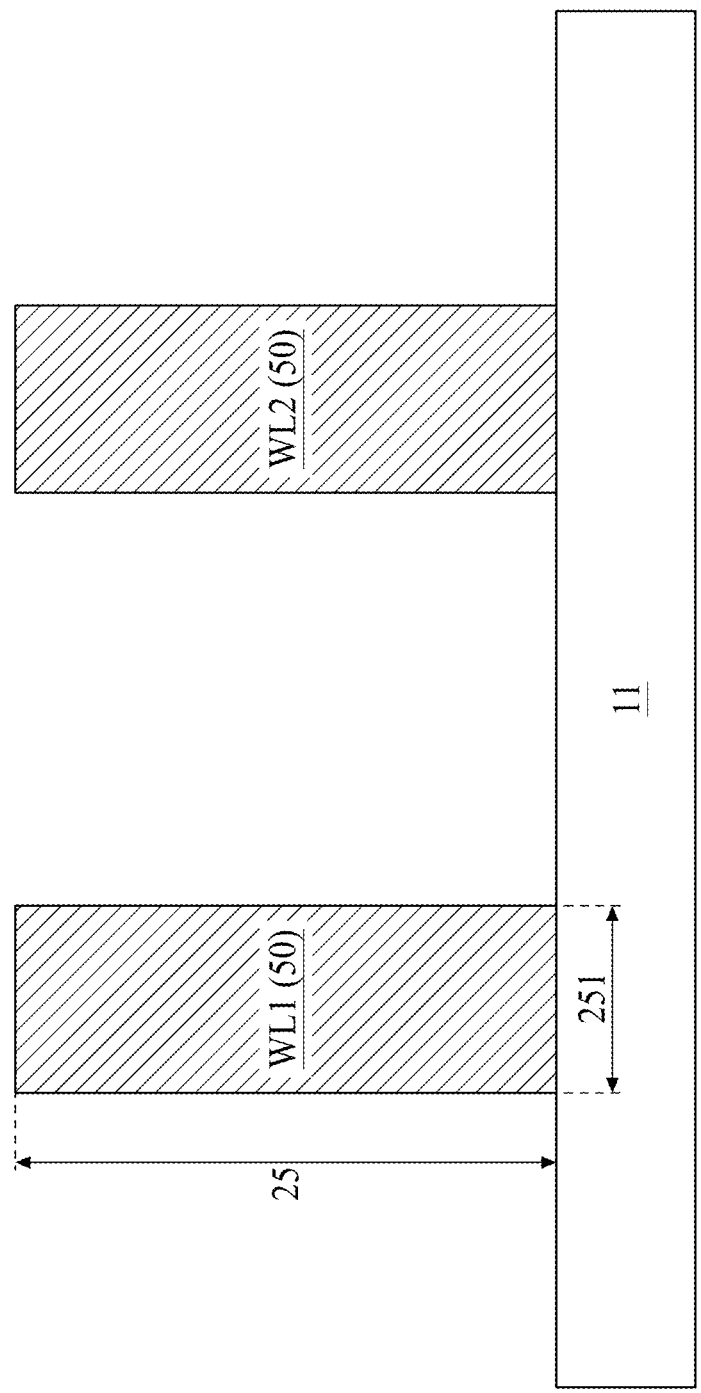
FIGS. 21 to 30 are cross-sectional diagrams of intermediate stages along a line B-B' shown in FIG. 3 in the formation of a semiconductor structure in accordance with some embodiments of the present disclosure.

Referring to FIG. 21, FIG. 21 is a schematic cross-sectional diagram along the line B-B' shown in FIG. 3 at a stage of the method S1 in accordance with some embodiments of the present disclosure. After the operation S1, the method S1 may further include formation of multiple word line structures 50. In some embodiments, the word line structures 50 include a word line structure WL1 and a word line structure WL2. In some embodiments, the word line structures WL1 and WL2 are formed over the substrate 11 as shown in FIG. 21. In some embodiments, the word line structures WL1 and WL2 are formed concurrently with, prior to, or after the formation of the bit line structures 20 as depicted in FIGS. 5 and 6. The formation of the word line structures WL1 and WL2 can be similar to the formation of the bit line structures 20, and repeated description is omitted herein. In some embodiments, the word line structures (e.g., WL1 and WL2) extend in an x-axis direction as seen in a top view, which is substantially perpendicular to the extending direction (i.e., a y-axis direction as seen in the top view) of the bit line structures 20 as shown in FIG. 3. In some embodiments, the word line structures WL1 and WL2 are electrically isolated from the bit line structures 20.

A detailed configuration of each of the word line structures 50 can be adjusted according to different applications, and is not limited herein. In some embodiments, the word line structures 50 include a material same as that of the second dielectric layer 23 of the bit line structures 20. In some embodiments, each of the word line structures 50 has a width 251 and a height 25.

Figure 22:
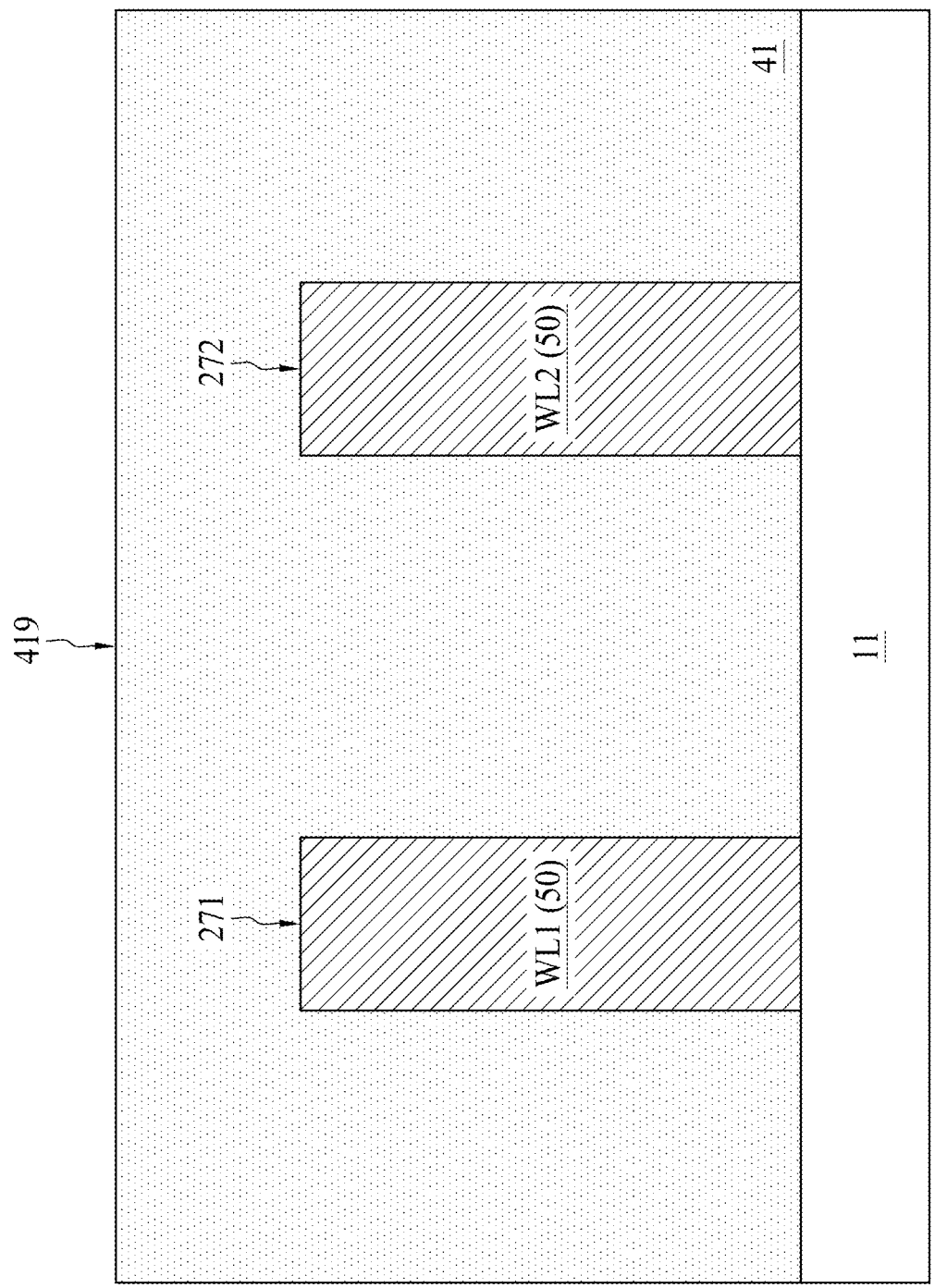

Referring to FIG. 22, FIG. 22 is a schematic cross-sectional diagram along the line B-B' shown in FIG. 3 at the stage of the method S1 as depicted in FIG. 9 in accordance with some embodiments of the present disclosure. In some embodiments, no spacer is formed around the word line structures WL1 and WL2. In some embodiments, the word line structures WL1 and WL2 are covered by a hard layer during the operations as depicted in FIGS. 7 and 8. In some embodiments, the polysilicon layer 41 covers an entirety of the word line structures WL1 and WL2. In some embodiments, the top surface 419 of the polysilicon layer 41 is above a top surface 271 of the word line structure WL1 and a top surface 272 of the word line structure WL2.

Figure 23:
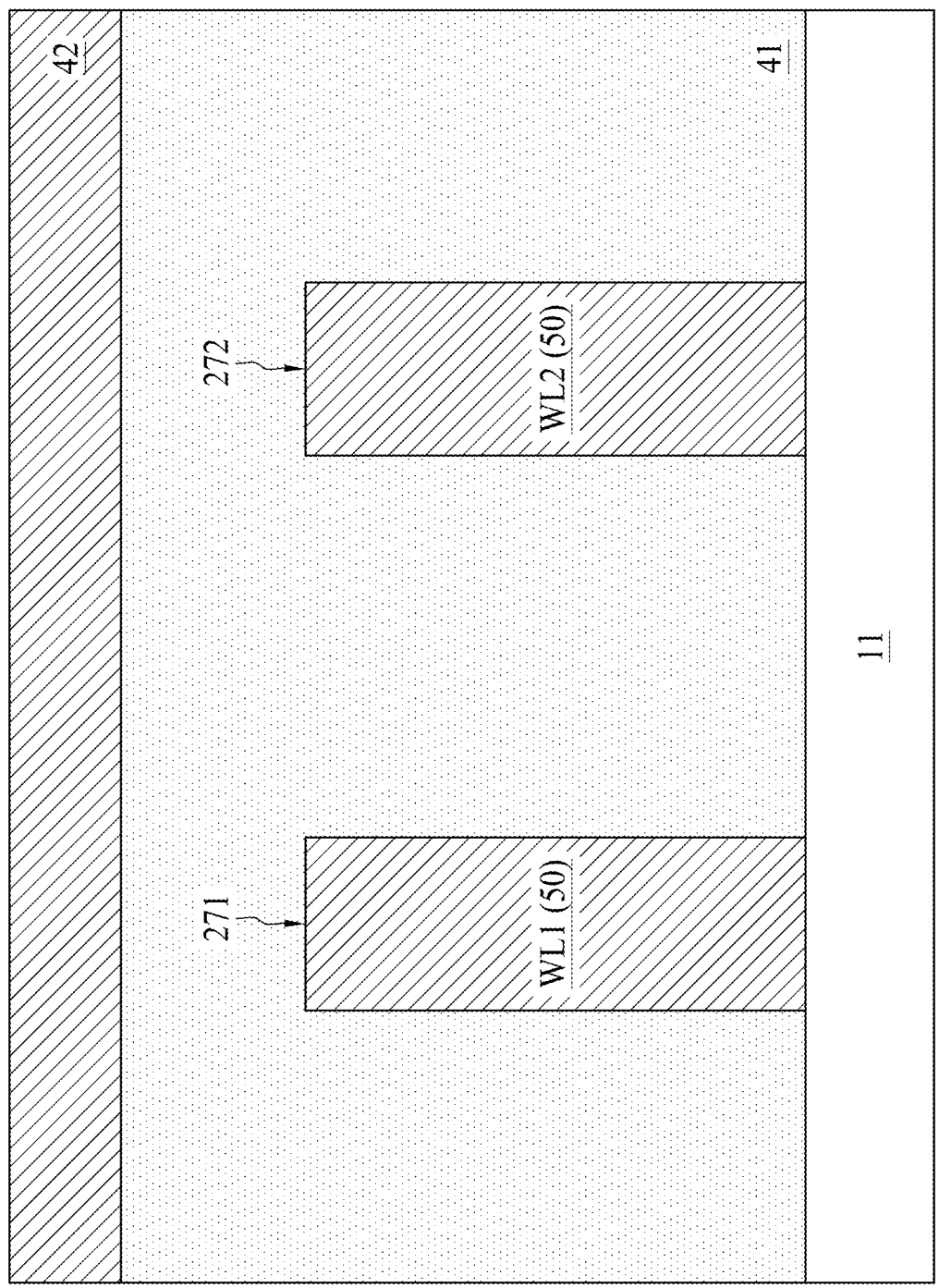

Referring to FIG. 23, FIG. 23 is a schematic cross-sectional diagram along the line B-B' shown in FIG. 3 at the stage of the method S1 as depicted in FIG. 10 in accordance with some embodiments of the present disclosure. In some embodiments, the sacrificial layer 42 is disposed over the word line structures WL1 and WL2. In some embodiments, the sacrificial layer 42 covers an entirety of the word line structures WL1 and WL2.

Figure 24:
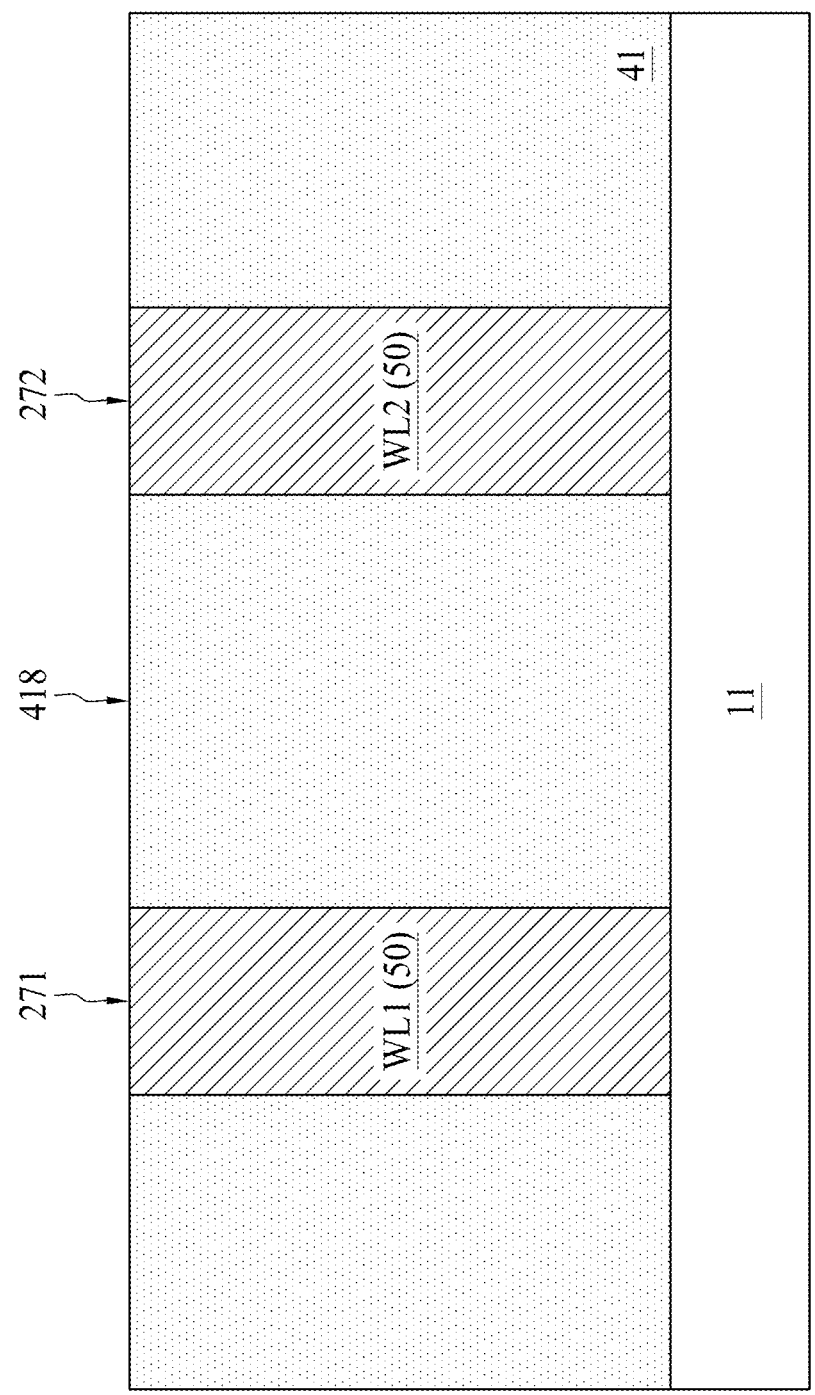

Referring to FIG. 24, FIG. 24 is a schematic cross-sectional diagram along the line B-B' shown in FIG. 3 at the stage of the method S1 as depicted in FIG. 11 in accordance with some embodiments of the present disclosure. In some embodiments, the top surfaces 271 and 272 of the word line structures WL1 and WL2 are exposed through the polysilicon layer 41. In some embodiments, the top surfaces 271 and 272 of the word line structures WL1 and WL2 are substantially coplanar with the top surface 418 of the polysilicon layer 41.

Figure 25:
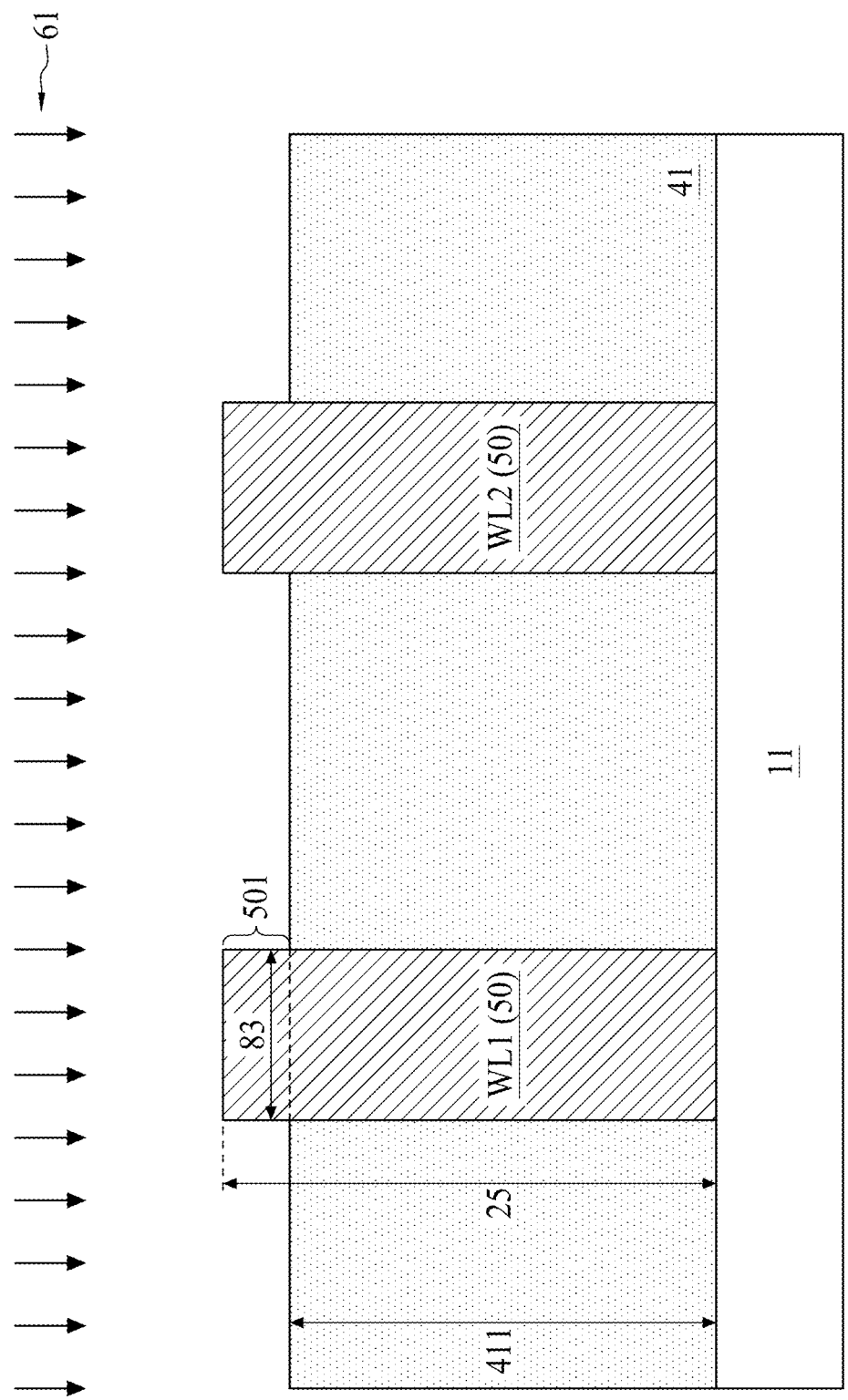

Referring to FIG. 25, FIG. 25 is a schematic cross-sectional diagram along the line B-B' shown in FIG. 3 at the stage of the method S1 as depicted in FIG. 12 in accordance with some embodiments of the present disclosure. It should be noted that the processing of the word line structures WL1 and WL2 can be simultaneous, and changes in configurations of the word line structures WL1 and WL2 can be similar or the same. Therefore, for a purpose of illustration, descriptions of operations of the method S1 focus only on the word line structure WL1 in the following illustration. Details of operations on the word line structure WL2 are omitted herein for a purpose of brevity.

In some embodiments, a first portion 501 of the word line structure WL1 includes a material same as that of the second dielectric layer 23 of the bit line structures 20. In some embodiments, the first portion 501 of each of the word line structures 50 protrudes from and is exposed through the polysilicon layer 41 after the first etching operation 61. In some embodiments, the first portion 501 of the word line structure WL1 is disposed above the polysilicon layer 41 after the first etching operation 61. In some embodiments, a width 83 of the first portion 501 of the word line structure WL1 is substantially equal to the width 251 of the word line structure WL1 shown in FIG. 21. In some embodiments, the first height 411 of the polysilicon layer 41 is less than the height 25 of the word line structures WL1.

Figure 26:
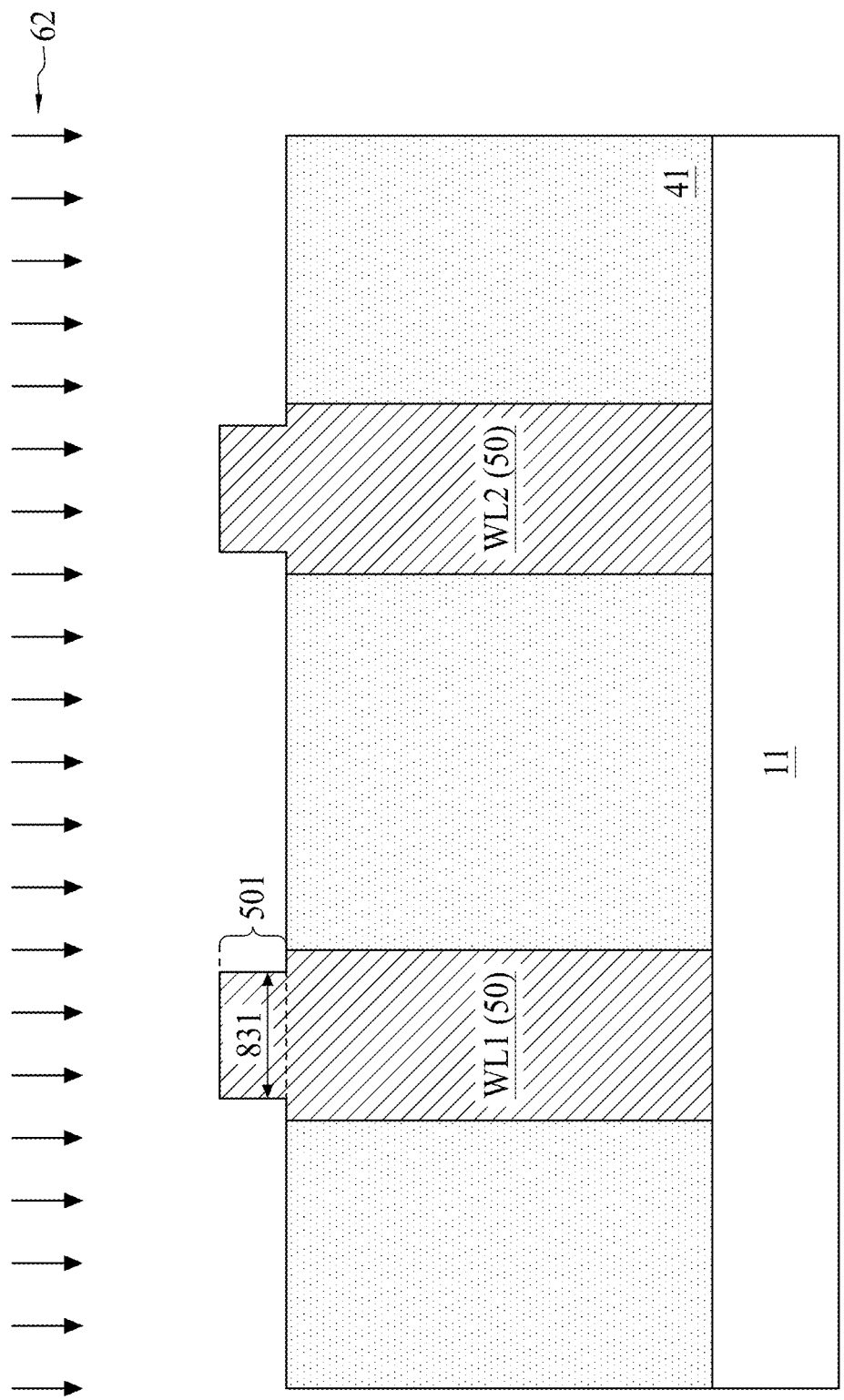

Referring to FIG. 26, FIG. 26 is a schematic cross-sectional diagram along the line B-B' shown in FIG. 3 at the stage of the method S1 as depicted in FIG. 13 in accordance with some embodiments of the present disclosure. In some embodiments, the second etching operation 62 is performed on the first portion 501 of the word line structure WL1. In some embodiments, a width of the first portion 501 is reduced during the second etching operation 62. In some embodiments, a width 831 of the first portion 501, reduced from the width 83 by the second etching operation 62, is obtained.

Figure 27:
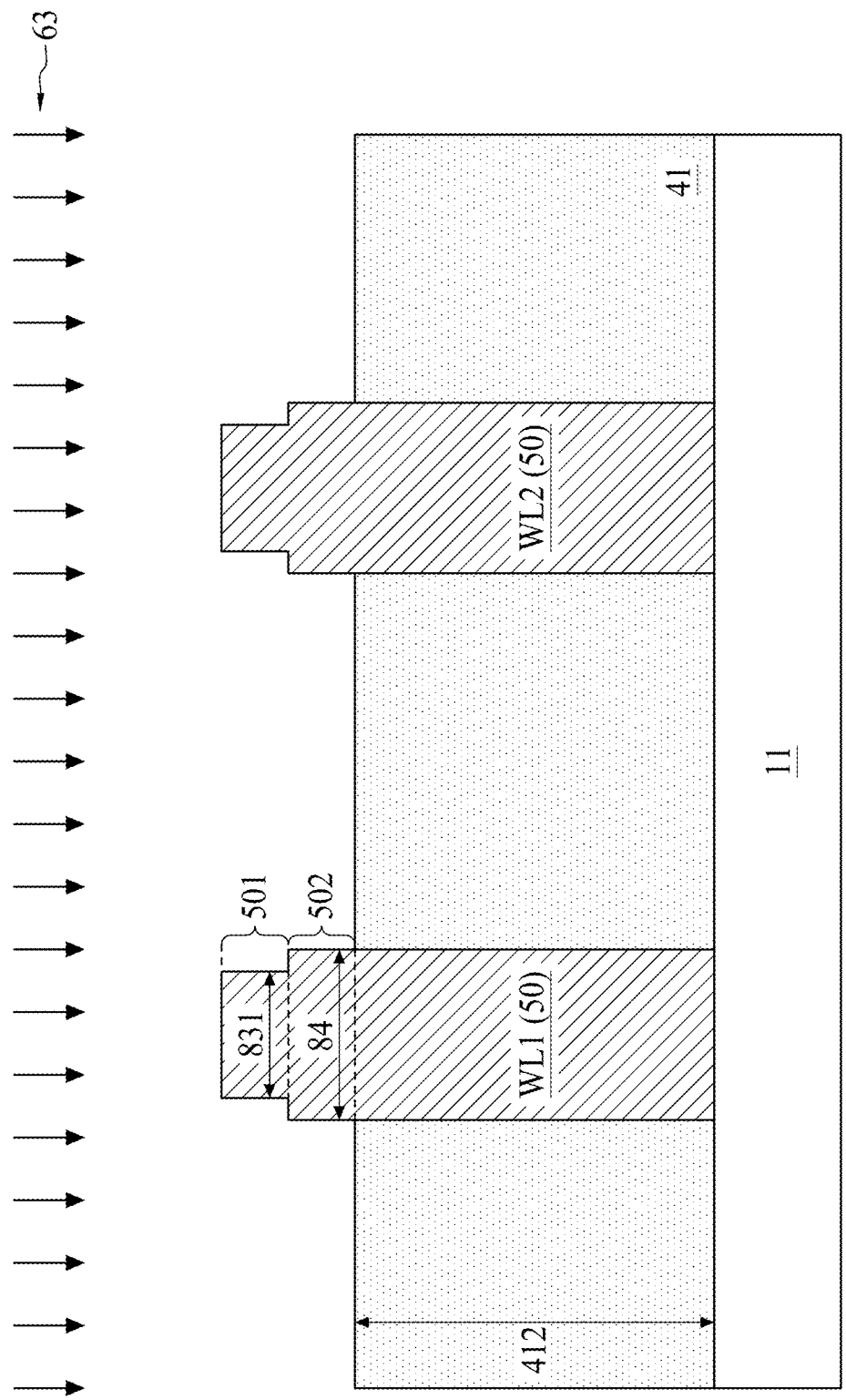

Referring to FIG. 27, FIG. 27 is a schematic cross-sectional diagram along the line B-B' shown in FIG. 3 at the stage of the method S1 as depicted in FIG. 14 in accordance with some embodiments of the present disclosure. In some embodiments, a second portion 502 of the word line structure WL1 protrudes from and is exposed through the polysilicon layer 41 after the third etching operation 63. In some embodiments, the second portion 502 of the word line structure WL1 is disposed below the first portion 501 and above the polysilicon layer 41. In some embodiments, the second portion 502 has a width 84 substantially equal to the width 251 of the word line structure WL1 shown in FIG. 21.

Figure 28:
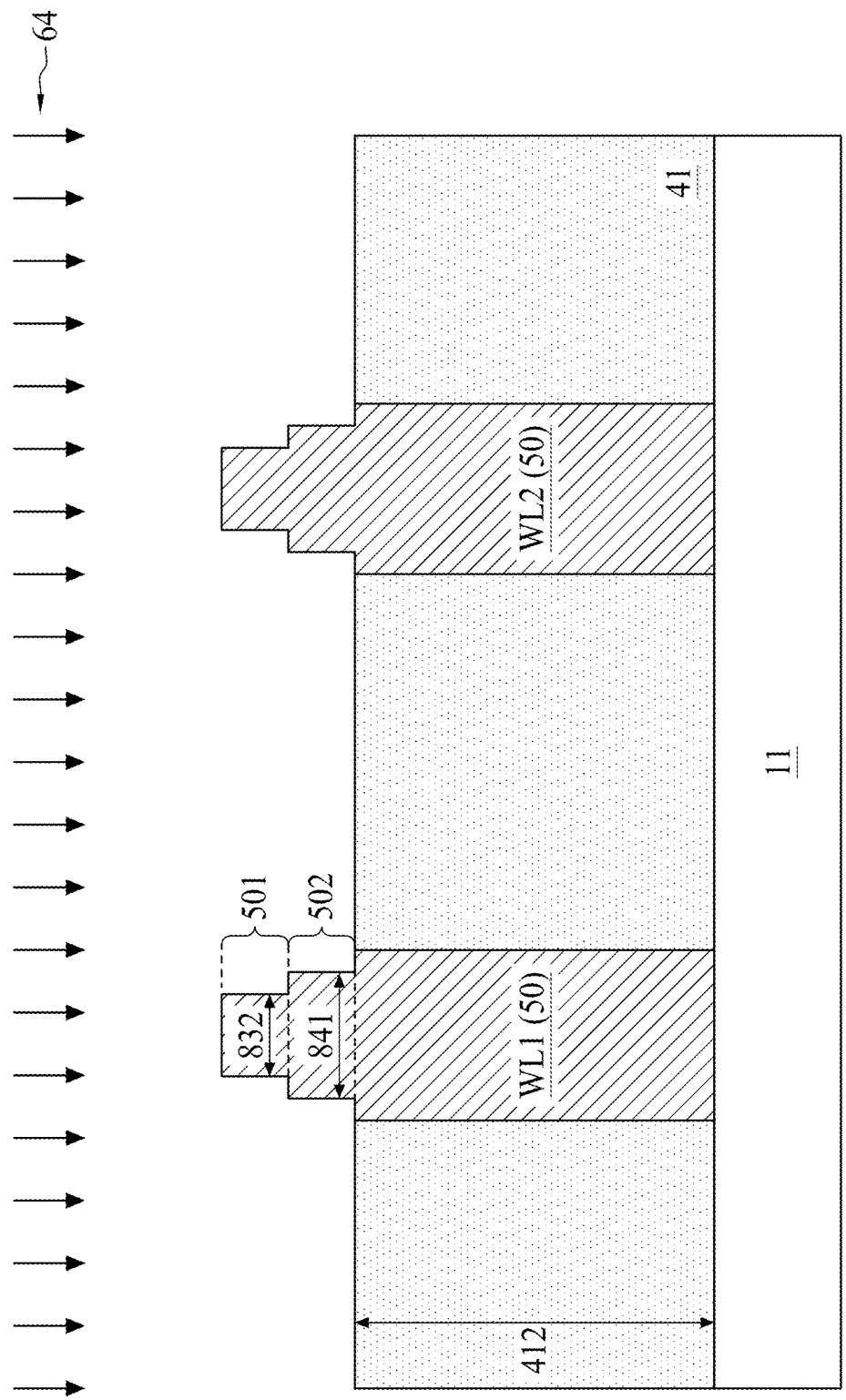

Referring to FIG. 28, FIG. 28 is a schematic cross-sectional diagram along the line B-B' shown in FIG. 3 at the stage of the method S1 as depicted in FIG. 15 in accordance with some embodiments of the present disclosure. In some embodiments, the fourth etching operation 64 is performed on the first portion 501 and the second portion 502 of the word line structure WL1. In some embodiments, a width of the first portion 501 and a width of the second portion 502 are reduced during the fourth etching operation 64. In some embodiments, a width 832 of the first portion 501, reduced from the width 831 by the fourth etching operation 64, is obtained. In some embodiments, a width 841 of the second portion 502, reduced from the width 84 by the fourth etching operation 64, is obtained. In some embodiments, the width 841 is greater than the width 832.

Figure 29:
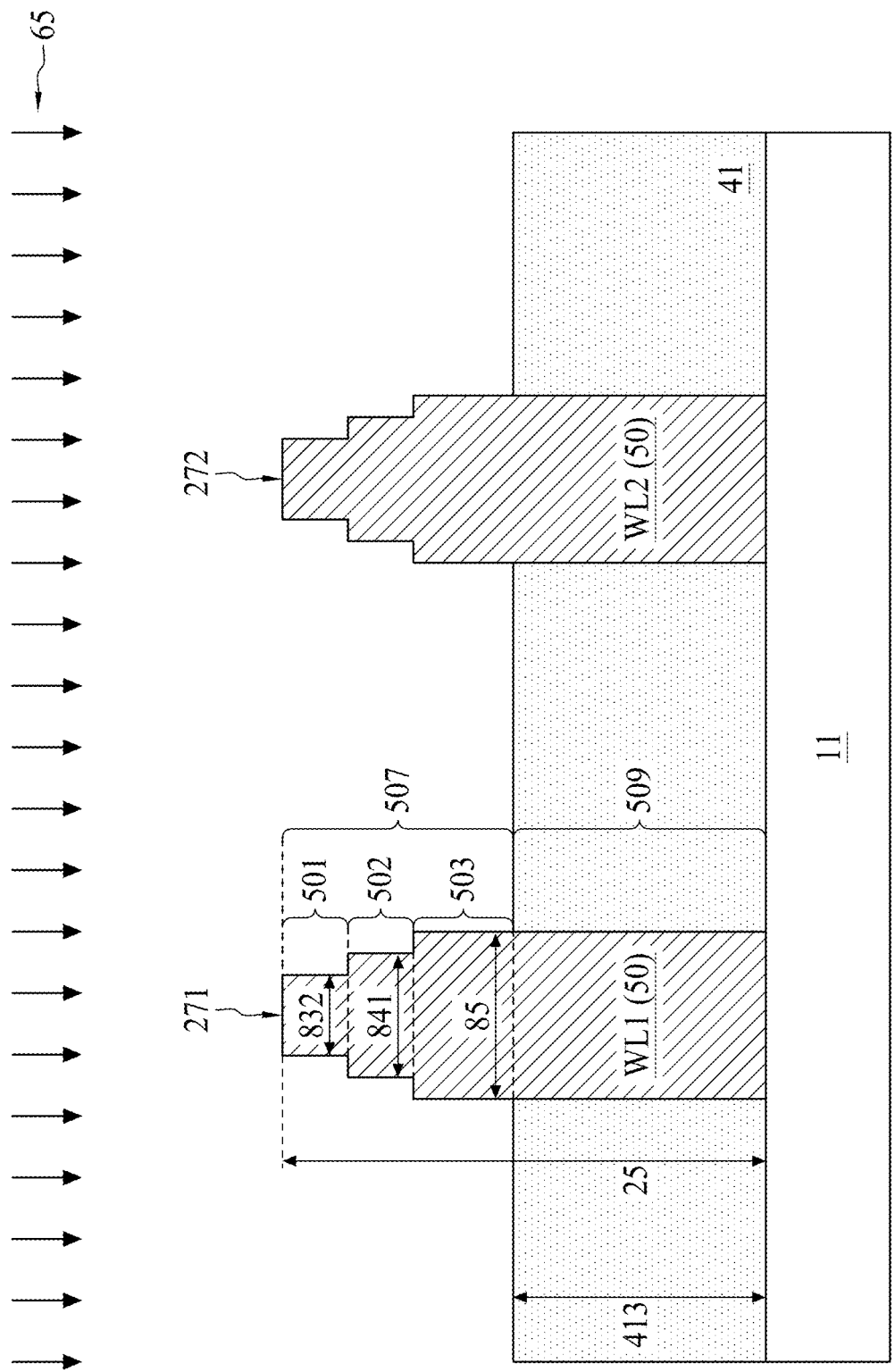

Referring to FIG. 29, FIG. 29 is a schematic cross-sectional diagram along the line B-B' shown in FIG. 3 at the stage of the method S1 as depicted in FIG. 16 in accordance with some embodiments of the present disclosure. In some embodiments, a third portion 503 of the word line structure WL1 protrudes from and is exposed through the polysilicon layer 41 after the fifth etching operation 65. In some embodiments, the third portion 503 of the word line structure WL1 is disposed below the second portion 502 and above the polysilicon layer 41. In some embodiments, the third portion 503 has a width 85 substantially equal to the width 251 of the word line structure WL1 shown in FIG. 21. Therefore, a stepped configuration of an upper portion 507 of the word line structure WL1 is formed above the polysilicon layer 41. In some embodiments, the upper portion 507 includes the first portion 501, the second portion 502, and the third portion 503. In some embodiments, the upper portion 507 is tapered from a lower portion 509 toward the top surface 271 of the word line structure WL1. In some embodiments, the lower portion 509 of the word line structure WL1 is surrounded by the polysilicon layer 41 and retains a cylindrical configuration. In some embodiments, the width 832 is substantially equal to or greater than 12 nm. In some embodiments, when the width 251 of the word line structure WL1 and the width 28 of the bit line structure BL1 are substantially equal, the width 832 of the first portion 501 of the word line structure WL1 is less than the width 811 of the first portion 201 of the bit line structure BL1 shown in FIG. 16 since no spacer is formed surrounding the word line structure WL1. In some embodiments, the height 25 of the word line structure WL1 remains substantially consistent from before the first etching operation 61 until after the fifth etching operation 65.

Figure 30:
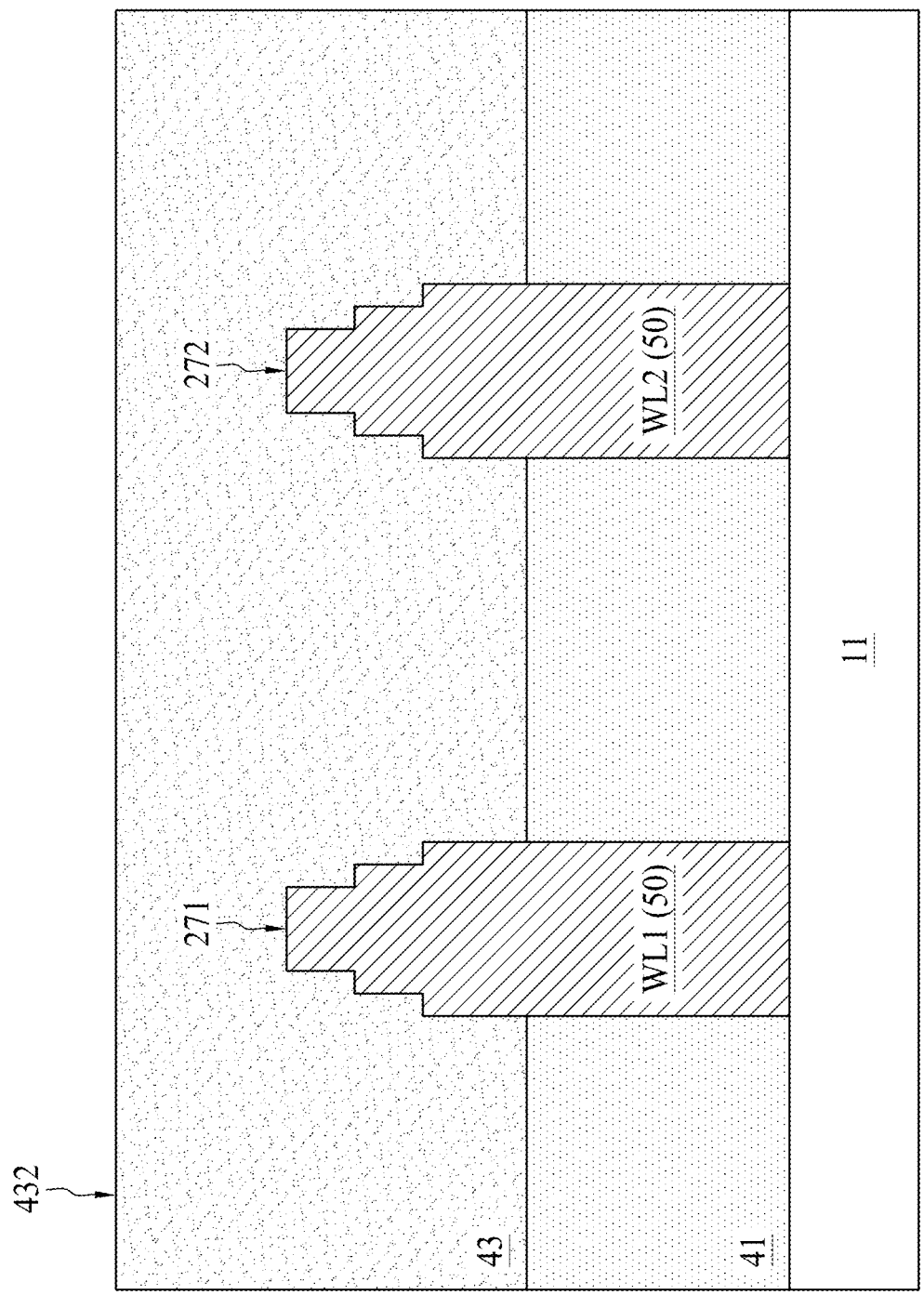

Referring to FIG. 30, FIG. 30 is a schematic cross-sectional diagram along the line B-B' shown in FIG. 3 at the stage of the method S1 as depicted in FIGS. 17 and 18 in accordance with some embodiments of the present disclosure. In some embodiments, the top surface 432 of the metal layer 43 is above the top surfaces 271 and 272 of the word line structures WL1 and WL2. The operations as depicted in FIG. 19 or of a conventional method can be applied to the structure shown in FIG. 30, and detailed description of such processing is omitted herein.

Therefore, the present disclosure provides a novel structure of a bit line structure and a method for manufacturing the same. The bit line structure of the present disclosure has a tapered configuration or a stepped configuration that is approximately conformal to a profile of an adjacent landing pad. The bit line structure of the present disclosure does not have a sharp corner, and electrical disconnection can be avoided. In addition, a top of the tapered portion (or the step portion) of the bit line structure is not excessively thin (or excessively sharp), and as a result, damage to the bit line structure by subsequent processing can be prevented.

One aspect of the present disclosure provides a semiconductor structure. The semiconductor structure includes a substrate; a bit line structure, disposed over the substrate, wherein the bit line structure includes a cylindrical portion and a step portion above the cylindrical portion; a polysilicon layer, disposed over the substrate and around the bit line structure; and a landing pad, disposed over the polysilicon layer and the step portion.

Another aspect of the present disclosure provides a semiconductor structure. The semiconductor structure includes: a substrate; a bit line structure, disposed on the substrate and extending in a first direction; and a polysilicon layer, disposed around a lower portion of the bit line structure, wherein an upper portion of the bit line structure is tapered from the lower portion toward a top surface of the bit line structure.

Another aspect of the present disclosure provides a method of manufacturing a semiconductor structure. The method includes: providing a substrate; forming a bit line structure over the substrate; forming a spacer surrounding the bit line structure; forming a polysilicon layer covering the bit line structure and the spacer; performing a first etching operation on the polysilicon layer to obtain a first height of the polysilicon layer, wherein the first height is less than a height of the bit line structure or a height of the spacer; performing a second etching operation on a first portion of the spacer; and performing a third etching operation on the polysilicon layer to obtain a second height of the polysilicon layer, wherein the second height is less than the first height.

In conclusion, the application discloses a manufacturing method of a semiconductor structure and a semiconductor structure thereof. Multiple etching operations are provided on the polysilicon layer and the bit line structures to result in a stepped configuration or a tapered configuration of the bit line structure. A presence of a stepped portion of the bit line structure provides a larger process window for formation of a landing pad in subsequent processing, and thus a better product yield can be provided.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
   a substrate;
   a bit line structure, disposed over the substrate, wherein the bit line structure includes a cylindrical portion and a step portion above the cylindrical portion;
   a polysilicon layer, disposed over the substrate and around the bit line structure; and
   a landing pad, disposed over the polysilicon layer and the step portion.

2. The semiconductor structure of claim 1, wherein a top surface of the step portion is a top surface of the bit line structure.

3. The semiconductor structure of claim 1, wherein the step portion is entirely above the polysilicon layer.

4. The semiconductor structure of claim 1, further comprising:
   a spacer, disposed between the polysilicon layer and the bit line structure, wherein the spacer surrounds the cylindrical portion of the bit line structure.

5. The semiconductor structure of claim 4, wherein the spacer is a multi-layer structure, and includes nitride and oxide.

6. The semiconductor structure of claim 4, wherein the spacer covers an entirety of the cylindrical portion of the bit line structure.

7. The semiconductor structure of claim 4, wherein a top surface of the spacer is above a top surface of the polysilicon layer.

8. The semiconductor structure of claim 1, wherein the step portion has differing widths along a height of the bit line structure.

9. The semiconductor structure of claim 1, wherein the bit line structure includes a conductive layer under a top surface of the polysilicon layer.

10. A semiconductor structure, comprising:
    a substrate;
    a bit line structure, disposed on the substrate and extending in a first direction; and
    a polysilicon layer, disposed around a lower portion of the bit line structure, wherein an upper portion of the bit line structure is tapered from the lower portion toward a top surface of the bit line structure.

11. The semiconductor structure of claim 10, further comprising:
    a metal layer, disposed over the polysilicon layer and partially covering the upper portion of the bit line structure.

12. The semiconductor structure of claim 11, wherein the metal layer includes an opening exposing a portion of the upper portion of the bit line structure.

13. The semiconductor structure of claim 10, further comprising:
    a word line structure, disposed on the substrate and extending in a second direction different from the first direction.

14. The semiconductor structure of claim 13, wherein the polysilicon layer surrounds a lower portion of the word line structure.

15. The semiconductor structure of claim 13, wherein the word line structure includes an upper portion tapered from the top surface of the polysilicon layer.

16. The semiconductor structure of claim 10, further comprising:
    a spacer, disposed on a sidewall of the bit line structure and surrounding the lower portion of the bit line structure.

17. The semiconductor structure of claim 16, wherein the spacer protrudes from the polysilicon layer.

18. The semiconductor structure of claim 16, wherein a portion of the spacer is exposed through a metal layer disposed over the bit line structure.

19. The semiconductor structure of claim 10, wherein the lower portion of the bit line structure protrudes from the top surface of the polysilicon layer.

* * * * *